United States Patent
Brust et al.

(10) Patent No.: US 9,128,378 B2
(45) Date of Patent: Sep. 8, 2015

(54) FORMING CONDUCTIVE METAL PATTERNS WITH REACTIVE POLYMERS

(71) Applicants: Thomas B. Brust, Webster, NY (US); Mark Edward Irving, Rochester, NY (US); Catherine A. Falkner, Rochester, NY (US)

(72) Inventors: Thomas B. Brust, Webster, NY (US); Mark Edward Irving, Rochester, NY (US); Catherine A. Falkner, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 63 days.

(21) Appl. No.: 14/071,765

(22) Filed: Nov. 5, 2013

(65) Prior Publication Data

US 2015/0125667 A1  May 7, 2015

(51) Int. Cl.
*G03F 7/20* (2006.01)
*G03F 7/30* (2006.01)
*G03F 7/40* (2006.01)
*G03F 7/004* (2006.01)
*G03F 7/029* (2006.01)
*C23C 18/40* (2006.01)
*C23C 18/20* (2006.01)
*C23C 18/16* (2006.01)

(52) U.S. Cl.
CPC ............ *G03F 7/20* (2013.01); *C23C 18/1603* (2013.01); *C23C 18/204* (2013.01); *C23C 18/40* (2013.01); *G03F 7/0041* (2013.01); *G03F 7/029* (2013.01); *G03F 7/30* (2013.01); *G03F 7/405* (2013.01)

(58) Field of Classification Search
CPC .. C23C 18/1603; C23C 18/40; C23C 18/204; G03F 7/265; G03F 7/405; G03F 7/20; G03F 7/30; G03F 7/0041
USPC ............ 430/18, 315, 319, 321, 324; 427/304, 427/305, 306
See application file for complete search history.

(56) References Cited

U.S. PATENT DOCUMENTS

| | | |
|---|---|---|
| 4,491,628 A | 1/1985 | Ito et al. |
| 6,436,615 B1 | 8/2002 | Brandow et al. |
| 7,399,579 B2 | 7/2008 | Deng et al. |
| 7,682,774 B2 | 3/2010 | Kim et al. |
| 7,934,966 B2 | 5/2011 | Sasaki et al. |
| 8,012,676 B2 | 9/2011 | Yoshiki et al. |
| 2003/0022102 A1 | 1/2003 | Hiraoka et al. |
| 2009/0205853 A1* | 8/2009 | Larsson et al. ............... 174/256 |

FOREIGN PATENT DOCUMENTS

| | | |
|---|---|---|
| EP | 2 154 182 A1 | 2/2010 |
| JP | 09-316046 | 12/1997 |
| JP | 2013-028772 A * | 2/2013 |
| WO | 2009/006010 | 1/2009 |

OTHER PUBLICATIONS

Computer-generated translation of JP 2013-028772 (Feb. 2013).*

* cited by examiner

*Primary Examiner* — John A McPherson
(74) *Attorney, Agent, or Firm* — J. Lanny Tucker

(57) ABSTRACT

A pattern is formed in a polymeric layer comprising a reactive composition that comprises: (a) a polymer comprising pendant -arylene-X—C(=O)—O— t-alkyl groups that comprise a blocking group that is cleavable to provide pendant -arylene-XH groups, (b) a compound that provides a cleaving acid upon exposure to radiation having a $\lambda_{max}$ of 150 nm and to 450 nm, which cleaving acid has a pKa of 2 or less as measured in water, and (c) optionally, a photosensitizer. The polymeric layer is imagewise exposed to suitable radiation to provide non-exposed regions and exposed regions comprising a de-blocked and crosslinked polymer with pendant -arylene-XH groups. The exposed regions are contacted with electroless seed metal ions in the de-blocked and crosslinked polymer. After reduction, the corresponding electroless seed metal nuclei are electrolessly plated using a suitable metal that is the same as or different from the corresponding electroless seed metal nuclei.

18 Claims, No Drawings

FORMING CONDUCTIVE METAL PATTERNS WITH REACTIVE POLYMERS

RELATED APPLICATIONS

Reference is hereby made to:

Copending and commonly assigned U.S. Ser. No. 14/071,879 filed on Nov. 5, 2013 by Brust, Falkner, Irving, and Wyand and entitled "Forming Conductive Metal Patterns Using Reactive Polymers."

Copending and commonly assigned U.S. Ser. No. 14/071,916 filed on Nov. 5, 2013 by Irving and Brust and entitled) "Electroless Plating Method."

Copending and commonly assigned U.S. Ser. No. 14/071,951 filed on Nov. 5, 2013 by Irving and Brust and entitled "Electroless Plating Using Bleaching."

Copending and commonly assigned U.S. Ser. No. 14/071,993 filed on Nov. 5, 2013 by Irving and Brust and entitled "Electroless Plating Method Using Halide."

Copending and commonly assigned U.S. Ser. No. 14/072,049 filed on Nov. 5, 2013 by Irving and Brust and entitled "Electroless Plating Method Using Non-Reducing Agent."

FIELD OF THE INVENTION

This invention relates to methods for forming metallic patterns, for example using electroless plating, using reactive polymers that can be crosslinked upon suitable irradiation.

BACKGROUND OF THE INVENTION

In recent decades accompanying rapid advances in information-oriented society, there have also been rapid technological advances to provide devices and systems for gathering and communicating information. Of these, display devices have been designed for television screens, commercial signage, personal and laptop computers, personal display devices, and phones of all types, to name the most common information sharing devices.

As the increase in the use of such devices has exploded in frequency and necessity by displacing older technologies, there has been a concern that electromagnetic radiation emission from such devices may cause harm to the human body or neighboring devices or instruments over time. To diminish the potential effects from the electromagnetic radiation emission, display devices are designed with various transparent conductive materials that can be used as electromagnetic wave shielding materials.

In display devices where a continuous conductive film is not practical for providing this protection from electromagnetic radiation emission, it has been found that conductive mesh or patterns can be used for this electromagnetic wave shielding purpose for example as described in U.S. Pat. No. 7,934,966 (Sasaki et al.).

Other technologies have been developed to provide new microfabrication methods to provide metallic, two-dimensional, and three-dimensional structures with conductive metals. Patterns have been provided for these purposes using photolithography and imaging through mask materials as described for example in U.S. Pat. No. 7,399,579 (Deng et al.).

Improvements have been proposed for providing conductive patterns using photosensitive silver salt compositions such as silver halide emulsions as described for example in U.S. Pat. No. 8,012,676 (Yoshiki et al.). Such techniques have a number of disadvantages that are described in this patent and the efforts continue to make additional improvements.

In addition, as the noted display devices have developed in recent years, attraction has increased greatly for the use of touch screen technology whereby a light touch on the screen surface with a finger or stylus can create signals to cause changes in screen views or cause the reception or sending of information, telecommunications, interaction with the internet, and many other features that are being developed at an ever-increasing pace of innovation. The touch screen technology has been made possible largely by the use of transparent conductive grids on the primary display so that the location of the noted touch on the screen surface can be detected by appropriate electrical circuitry and software.

For a number of years, touch screen displays have been prepared using indium tin oxide (ITO) coatings to create arrays of capacitive patterns or areas used to distinguish multiple point contacts. ITO can be readily patterned using known semiconductor fabrication methods including photolithography and high vacuum processing. However, the use of ITO coatings has a number of disadvantages. Indium is an expensive rare earth metal and is available in limited supply. Moreover, ITO is a ceramic material and is not easily bent or flexed and such coatings require expensive vacuum deposition methods and equipment. In addition, ITO conductivity is relatively low, requiring short line lengths to achieve desired response rates (upon touch). Touch screens used in large displays are broken up into smaller segments in order to reduce the conductive line length to an acceptable electrical resistance. These smaller segments require additional driving and sensing electronics, further adding to the cost of the devices.

Silver is an ideal conductor having conductivity that is 50 to 100 times greater than that of ITO. Unlike most metal oxides, silver oxide is still reasonably conductive and its use reduces the problem of making reliable electrical connections. Moreover, silver is used in many commercial applications and is available from numerous commercial sources.

In other technologies, transparent polymeric films have been treated with conductive metals such as silver, copper, nickel, and indium by such methods as sputtering, ion plating, ion beam assist, wet coating, as well as the vacuum deposition. However, all of these technologies are expensive, tedious, or extremely complicated so that the relevant industries are spending considerable resources to design improved means for forming conductive patterns for various devices especially touch screen displays.

A similar level of transparency and conductivity for patterns can be achieved by producing very fine lines of about 5-6 µm in width of highly conductive material such as copper or silver metal or conductive polymers. There is a need for a way to make these thin conductive lines with less expensive materials and plating techniques in order to achieve a substantial improvement in cost, reliability, and availability of conductive patterns for various display devices. The present invention addresses this need as described in considerable detail below.

SUMMARY OF THE INVENTION

The present invention provides a method for forming a pattern in a polymeric layer, the method comprising:

providing a polymeric layer comprising a reactive composition that comprises:

(a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer, patternwise exposing the polymeric layer to radiation having a $\lambda_{max}$ of at least 150 nm and up to and including 450 nm, to provide a polymeric layer comprising non-exposed regions and exposed regions comprising a polymer comprising pendant -arylene-XH groups, optionally heating the polymeric layer simultaneously with or after patternwise exposing the polymeric layer but before contacting the exposed regions of the polymeric layer with electroless seed metal ions, at a temperature sufficient to generate pendant -arylene-XH groups in the (a) reactive polymer in the exposed regions of the polymeric layer, contacting the exposed regions of the polymeric layer with electroless seed metal ions to form a pattern of electroless seed metal ions in the exposed regions of the polymeric layer, reducing the pattern of electroless seed metal ions to provide corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

This invention also provides a precursor article useful in the practice of this invention, which precursor article comprises a substrate and having disposed thereon a polymeric layer comprising a reactive composition that comprises:

(a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

This method can provide an intermediate article comprising a substrate and having disposed thereon a polymeric layer comprising exposed regions and non-exposed regions, the exposed regions comprising a pattern of corresponding electroless seed metal nuclei in a de-blocked and crosslinked polymer derived from (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and the non-exposed regions comprising a reactive composition that comprises:

the (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

Moreover, the method of the present invention provides a product article comprising a substrate and having disposed thereon a polymeric layer comprising exposed regions and non-exposed regions, the exposed regions comprising corresponding electroless seed metal nuclei that has been electrolessly plated with the same or different metal in a de-blocked and crosslinked polymer derived from (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and the non-exposed regions comprising a reactive composition that comprises:

the (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

Another embodiment provides a method for forming a pattern in a polymeric layer, the method comprising:

providing a polymeric layer comprising a reactive composition that comprises:

a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer, patternwise exposing the polymeric layer to radiation having a $\lambda_{max}$ of at least 150 nm and up to and including 450 nm, to provide a polymeric layer comprising non-exposed regions and exposed regions comprising a polymer comprising pendant -arylene-XH groups, optionally heating the polymeric layer simultaneously with or after patternwise exposing the polymeric layer but before contacting the exposed regions of the polymeric layer with a reducing agent, at a temperature sufficient to generate pendant -arylene-XH groups in the (a) reactive polymer in the exposed regions of the polymeric layer, contacting the exposed regions of the polymeric layer with a reducing agent to incorporate reducing agent into the exposed regions of the polymeric layer, contacting the exposed regions of the polymeric layer with electroless seed metal ions to oxidize the reducing agent in the exposed regions of the polymeric layer and to form corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

The noted method can provides an intermediate article comprising a substrate and having disposed thereon a polymeric layer comprising exposed regions and non-exposed regions, the exposed regions comprising a pattern of corresponding electroless seed metal nuclei in a de-blocked and crosslinked polymer derived from the (a) reactive polymer in the reactive composition described herein, and the non-exposed regions comprising a reactive composition that comprises: (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

Yet another intermediate article provided by this method comprises a substrate and has disposed thereon a polymeric layer comprising exposed regions and non-exposed regions, the exposed regions comprising a de-blocked and crosslinked polymer derived from (a) reactive polymer in a reactive composition as described herein, into which a reducing agent has diffused, and the non-exposed regions comprising a reactive composition that comprises: (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

Another embodiment is a method for forming a pattern in a polymeric layer, the method comprising:

providing a polymeric layer comprising a reactive composition that comprises:

a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer, and patternwise exposing the polymeric layer to radiation having a $\lambda_{max}$ of at least 150 nm and up to and including 450 nm, to provide a polymeric layer comprising non-exposed regions and exposed regions comprising a polymer comprising pendant -arylene-XH groups, optionally heating the polymeric layer simultaneously with or after patternwise exposing the polymeric layer but before contacting both the non-exposed regions and the exposed regions of the polymeric layer with a reducing agent at a temperature sufficient to generate pendant -arylene-XH groups in the (a) reactive polymer in the exposed regions of the polymeric layer, contacting both the non-exposed regions and the exposed regions of the polymeric layer with a reducing agent, bleaching the polymeric layer to remove surface amounts of the reducing agent in both non-exposed regions and exposed regions of the polymeric layer, contacting the exposed regions of the polymeric layer with electroless seed metal ions to oxidize the reducing agent and to form corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

Still another embodiment is a method for forming a pattern in a polymeric layer, the method comprising:

providing a polymeric layer comprising a reactive composition that comprises:

(a) a reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer, patternwise exposing the polymeric layer to radiation having a $\lambda_{max}$ of at least 150 nm and up to and including 450 nm, to provide a polymeric layer comprising non-exposed regions and first exposed regions comprising a polymer comprising pendant -arylene-XH groups, optionally heating the polymeric layer simultaneously with or after patternwise exposing the polymeric layer but before contacting the first exposed regions of the polymeric layer with electroless seed metal ions at a temperature sufficient to generate pendant -arylene-XH groups in the (a) reactive polymer in the first exposed regions of the polymeric layer, contacting the first exposed regions of the polymeric layer with electroless seed metal ions to form electroless seed metal ions in the first exposed regions of the polymeric layer, contacting the first exposed regions of the polymeric layer with a halide to react with the electroless seed metal ions and to form corresponding electroless seed metal halide in the first exposed regions of the polymeric layer, optionally exposing the polymeric layer to convert at least some of the corresponding electroless seed metal halide in the first exposed regions to corresponding electroless seed metal image and to form second exposed regions in the polymeric layer, optionally contacting the polymeric layer with a reducing agent either: (i) to develop the corresponding electroless seed metal nuclei in the second exposed regions of the polymeric layer, or (ii) to develop all of the corresponding electroless seed metal halide in the first exposed regions, optionally contacting the polymeric layer with a fixing agent to remove any remaining corresponding electroless seed metal halide in either the first exposed regions, the second exposed regions, or both of the first exposed regions and the second exposed regions, and electrolessly plating the corresponding electroless seed metal nuclei in the first exposed regions, the second exposed regions, or both the first exposed regions and the second exposed regions, of the polymeric layer with a metal that is the same as or different from the corresponding electroless seed metal nuclei.

This method can also provide an intermediate article comprising a substrate and having disposed thereon a polymeric layer comprising first exposed regions and non-exposed regions, the first exposed regions comprising corresponding electroless seed metal halide in (a) a polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and the non-exposed regions comprising a reactive composition that comprises:

the (a) a polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

Yet another embodiment is a method for forming a pattern in a polymeric layer, the method comprising:

providing a polymeric layer comprising a reactive composition that comprises:

(a) a polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer, patternwise exposing the polymeric layer to radiation having a $\lambda_{max}$ of at least 150 nm and up to and including 450 nm, to provide a polymeric layer comprising non-exposed regions and exposed regions comprising a polymer comprising pendant -arylene-XH groups, optionally heating the polymeric layer simultaneously with or after patternwise exposing the polymeric layer but before contacting the exposed regions of the polymeric layer with electroless seed metal ions as a temperature sufficient to generate pendant -arylene-XH groups in the (a) reactive polymer in the exposed regions of the polymeric layer, contacting the exposed regions of the polymeric layer with electroless seed metal ions to form a pattern of electroless seed metal ions in the exposed regions of the polymeric layer, optionally contacting the pattern of electroless seed metal ions in the exposed regions of the polymeric layer with a non-reducing reagent that reacts with the electroless seed metal ions to form a bound electroless seed metal compound, and electrolessly plating the bound electroless seed metal compound in the exposed regions of the polymeric layer with a metal that is the same or different from the metal that is within the bound electroless seed metal compound.

This method can also provide an intermediate article comprising a substrate and having disposed thereon a polymeric layer comprising exposed regions and non-exposed regions, the exposed regions comprising a pattern of an electroless seed metal compound comprising a non-reducing reagent in a de-blocked and crosslinked polymer derived from (a) a polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and the non-exposed regions comprising a reactive composition that comprises:

the (a) a polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

The present invention provides a method for forming conductive metal patterns using a specifically designed reactive polymer in combination with an acid providing (or acid-generating) compound. The reactive polymer can undergo one or more chemical reactions in the presence of the generated strong acid (pKa of less than 2) to provide reactive acid sites that will complex with catalytic metal ions such as silver ions or palladium ions. The chemical reactions also increase the hydrophilicity of exposed regions to allow diffusion of hydrophilic compounds such as aqueous metal ions, non-reducing agents, and reducing agents, and to promote strong adhesion of the polymeric layer to a substrate using crosslinking to minimize dissolution in various aqueous-based baths, solutions, or dispersions used in electroless plating methods.

The necessary pendant -arylene-XH groups are generated in the reactive polymer in the presence of the strong acid generated during exposure for example to ultraviolet light. The resulting pendant -arylene-XH groups increase the hydrophilicity of the polymer and are then available to complex or react with metal ions and take part in crosslinking reactions within the polymeric layer.

The present invention avoids the use of known expensive high vacuum processes necessary for making conductive patterns using indium tin oxide (ITO) coatings and is more readily carried out using high-speed roll-to-roll machines to provide higher manufacturing efficiencies.

DETAILED DESCRIPTION OF THE INVENTION

Definitions

As used herein to define various ethylenically unsaturated polymerizable monomer components of the reactive polymers, aqueous-based solutions, reactive compositions, and polymeric layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this trimmer, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to polymers that have the same repeating or recurring unit along a reactive polymer backbone. The term "copolymer" refers to polymers composed of two or more different repeating or recurring units that are arranged randomly along the reactive polymer backbone.

For reactive polymers used in the present invention, the term "arranged randomly" means that blocks of recurring units are not intentionally incorporated into the reactive polymers, but that recurring units are incorporated into the backbone in a random fashion using known polymerization procedures that do not encourage the formation of block copolymers.

Recurring units in polymers described herein are generally derived from the corresponding ethylenically unsaturated polymerizable monomers used in a polymerization process, which ethylenically unsaturated polymerizable monomers having the desired pendant groups. Alternatively, pendant groups can be formed or modified within recurring units after polymerization of ethylenically unsaturated polymerizable monomers having requisite precursor pendant groups.

The term "reactive polymer" is used herein to refer to the polymers described below that comprise at least one pendant labile group that can be changed, such as de-blocked (or unblocked), during appropriate irradiation in the presence of a (b) compound that can generate a cleaving acid during irradiation, to provide a pendant -arylene-XH group. The (b) compound can be considered a "photoacid generating compound" that absorbs appropriate radiation and undergoes suitable reaction or decomposition to release the described cleaving acid having a pKa of 2 or less as measured in water. As described below, the de-blocked polymer in the reactive composition then becomes crosslinked.

The term "aqueous-based" refers to solutions, baths, or dispersions in which the predominant solvent, or at least 50 weight % of the solvents, is water.

Unless otherwise indicated, the term "mol %" when used in reference to recurring units in reactive polymers, refers to either the nominal (theoretical) amount of a recurring unit based on the amount of ethylenically unsaturated polymerizable monomer used in the polymerization process, or to the actual amount of recurring unit in the resulting reactive polymer.

Reactive Polymers for Pattern Formation

In general, the reactive polymers useful in the practice of this invention have two essential features: (1) they have labile groups that upon exposure to suitable radiation are de-blocked and provide hydrophilic groups, and (2) upon such irradiation, they are capable of being crosslinked only in exposed regions. While the reactive polymers can be supplied as solutions in appropriate solvents, they are best used when applied to a substrate that can be a large or small surface, including the outer surfaces of inorganic or organic particles and then dried.

The reactive polymers can be either condensation or vinyl polymers as long as the requisite pendant labile groups that provide pendant -arylene-XH groups are connected to the polymer backbone. In most embodiments, the useful reactive polymers are vinyl polymers derived from one or more ethylenically unsaturated polymerizable monomers using suitable polymerization procedures including solution or emulsion polymerization techniques using appropriate initiators, surfactants, catalysts, and solvents, all of which would be readily apparent to one skilled in the art from the teaching provided herein.

The useful reactive polymers generally comprise at least some recurring units that comprise pendant groups attached to the polymer backbone, which pendant groups comprise a labile -arylene-X—C(=O)—O-t-alkyl group as described below. The term "labile" means that these labile groups can provide pendant -arylene-XH groups upon deblocking when the (a) reactive polymer and (b) compound are exposed to radiation having a $\lambda_{max}$ of at least 150 nm and up to and including 450 nm, or more likely exposed to radiation having a $\lambda_{max}$ of at least 150 nm and up to and including 330 nm (sometimes known as "short UV"). Prior to the noted irradiation (and optional heating described below), the labile groups are considered "blocked" and are not available for reaction or causing reaction.

The reactive polymers useful in the present invention can become de-blocked and crosslinked during the noted irradiation and generation of the pendant -arylene-XH groups. Such crosslinking does not require the presence of distinct or separate crosslinking agents within the polymeric layer (described below).

Once suitable pendant -arylene-XH groups are generated, the resulting polymer can be either more water-soluble or water-insoluble in irradiated or exposed regions of the polymeric layer, depending upon the extent of deblocking and crosslinking in the resulting polymeric layer.

The most useful (a) reactive polymers are addition polymers comprising pendant labile -arylene-X—C(=O)—O-t-alkyl groups covalently attached to the backbone. Such (a) reactive polymer embodiments are addition polymer comprising an all carbon backbone and -A- recurring units randomly forming this backbone, which -A- recurring units comprise the noted pendant labile groups.

Such pendant labile -arylene-X—C(=O)—O-t-alkyl groups can be indirectly or directly attached to the (a) reactive polymer backbone, such as an all carbon backbone derived from one or more ethylenically unsaturated polymerizable monomers that are incorporated using free radical solution polymerization. For example, such pendant labile -arylene-X—C(=O)—O-t-alkyl groups can be provided in ethylenically unsaturated polymerizable monomers including but not limited to, appropriate acrylates and methacrylates that can also comprise other functional groups as part of the backbone or as pendant groups. In most embodiments, the pendant labile -arylene-X—C(=O)—O-t-alkyl groups are directly attached to the carbon-carbon (a) reactive polymer backbone.

As used herein, the term "arylene" refers to substituted or unsubstituted divalent aromatic carbocyclic or heterocyclic groups having 6 to 14 carbon atoms and heteroatoms in the aromatic ring system, such as substituted or unsubstituted phenylene, substituted or unsubstituted naphthylene, substituted or unsubstituted anthracenylene groups, substituted or unsubstituted pyridine groups, substituted or unsubstituted pyrrole groups, substituted or unsubstituted furan groups, and substituted or unsubstituted thiophene groups. The substituted or unsubstituted aromatic carbocyclic groups such as the phenylene groups are particularly useful. Substituents for these groups would be readily apparent to one skilled in the art as long as the desired properties of the (a) reactive polymers were not adversely affected.

The (a) reactive polymer comprises pendant -arylene-X—C(=O)—O-t-alkyl groups wherein X is —NR—, —O—, or —S—. In particular, X is —NR— or —O—, and in most embodiments, X is —NR—.

In this pendant group, R is hydrogen or a substituted or unsubstituted alkyl group (linear, branched, or cyclic) having 1 to 6 carbon atoms. In many embodiments, R is hydrogen or methyl, and in other embodiments, R is hydrogen.

Also in this pendant group, t-alkyl represents a substituted or unsubstituted tertiary alkyl group having 4 to 8 carbon atoms, including but not limited to, a tertiary alkyl ester group having 4 carbon atoms (t-butyl), 5 carbon atoms (t-pentyl or 1,1-dimethylpropyl), 6 carbon atoms (t-hexyl, 1,1-dimethylt-butyl, or 1,1-dimethyl-iso-butyl) in the alkyl moiety of the alkyl ester group. An acrylate or methacrylate monomer comprising -arylene-X-t-butyl ester groups (t-boc) are particularly useful for making the (a) reactive polymers.

Thus, in some embodiments, the (a) reactive polymers comprise pendant -arylene-X—C(═O)—O-t-alkyl groups wherein X is —NR— or —O—, R is hydrogen or methyl, and t-alkyl is a t-butyl group.

Moreover, in some embodiments, the (a) reactive polymer is a vinyl polymer comprising pendant -phenylene-NH—C(═O)O-t-butyl groups. For example, the (a) reactive polymer can be a homopolymer comprising only recurring units that comprise the -arylene-X—C(═O)—O-t-alkyl groups.

In other embodiments, the (a) reactive polymer is a copolymer comprising:

-A- recurring units that comprise the same or different pendant -arylene-X—C(═O)—O-t-alkyl groups wherein X is —NR—, —O—, or —S—, R is hydrogen or an alkyl group, and t-alkyl is a tertiary alkyl group, from which —C(═O)—O-t-alkyl groups are cleavable using a cleaving acid, and -B- recurring units that are different from the -A- recurring units, wherein the -A- recurring units comprise at least 50 mol % and up to and including 99 mol % of the total recurring units.

Some useful (a) reactive polymer embodiments are derived at least in part from ethylenically unsaturated polymerizable monomers comprising pendant labile -arylene-XR—C(═O)—O-t-alkyl groups that can be derived from, for example, blocked phenyleneamino acrylates and blocked phenyleneamino methacrylates, blocked phenyleneamino 2-chloroacrylates, and blocked naphthyleneamino acrylates (and methacrylates).

The blocking —C(═O)—O-t-alkyl group can be cleaved from the (a) reactive polymer in the presence of a cleaving acid that is generated during the exposure to radiation having a $\lambda_{max}$ of at least 150 nm and up to and including 450 nm. This cleaving acid has a pKa of 2 or less as measured in water, or more typically it has a pKa of 0 or less as measured in water. Compounds that are useful for providing a cleaving acid are described below. In some embodiments, (a) reactive polymer is exposed to the noted radiation while in the presence of a photosensitizer as described below.

Particularly useful ethylenically unsaturated monomers from which the -A- recurring units can be derived include but are not limited to:

t-butoxycarbonyl 2-aminophenyl methacrylate;
t-butoxycarbonyl 3-aminophenyl methacrylate;
t-butoxycarbonyl 4-aminophenyl methacrylate;
t-butoxycarbonyl 2-aminophenyl acrylate;
t-butoxycarbonyl 3-aminophenyl acrylate;
t-butoxycarbonyl 4-aminophenyl acrylate;
1,1-dimethylpentoxycarbonyl 2-aminophenyl methacrylate;
1,1-dimethylpentoxycarbonyl 3-aminophenyl methacrylate;
1,1-dimethylpentoxycarbonyl 4-aminophenyl methacrylate;
t-butoxycarbonyl 2-amino-2-methylphenyl methacrylate;
t-butoxycarbonyl 3-amino-2-methylphenyl methacrylate;
t-butoxycarbonyl 4-amino-2-methylphenyl methacrylate;
t-butoxycarbonyloxystyrene;
4-t-butoxycarbonyloxyphenyl(meth)acrylate; and
4-t-butoxycarbonylthiophenyl(meth)acrylate.

In some embodiments, the (a) reactive polymer is a polymer comprising the same or different -A- recurring units (that is, the same or different recurring units having -arylene-X—C(═O)—O-t-alkyl groups). Thus, the (a) reactive polymers are homopolymers comprising the same recurring units, or copolymers comprising a mixture of recurring units that have different pendant labile (blocked) groups.

However, in other embodiments, the (a) reactive polymer can also be a copolymer comprising: -B- recurring units that are different from the -A- recurring units. A skilled polymer chemist would understand how to choose such additional -B- recurring units, and for example, they can be derived from one or more ethylenically unsaturated polymerizable monomers selected from the group consisting of alkyl acrylates (including benzyl acrylate), alkyl methacrylates (including benzyl methacrylate), (meth)acrylamides, styrene and styrene derivatives, vinyl imides, and mixtures thereof. It is apparent that the -B- recurring units can have pendant substituted or unsubstituted alkyl groups (including substituted or unsubstituted benzyl groups), substituted or unsubstituted aryl groups (such as substituted or unsubstituted phenyl groups), alkyl ester groups, or aryl ester groups. Many useful -B- recurring units comprise alkyl ester groups wherein the alkyl moiety has 1 to 7 carbon atoms and is linear, branched, or cyclic in form, and can include benzyl ester groups. Such -B- recurring units are not purposely added to provide crosslinking after irradiation of the polymeric layer.

In the (a) reactive polymers, the -A- recurring units can comprise at least 50 mol % and up to and including 100 mol % of the total recurring units, but in many embodiments, the -A- recurring units can comprise up to and including 99 mol % of the total recurring units, or even up to and including 80 mol % of the total recurring units. The -B- recurring units can be present in an amount of at least 1 mol % and up to and including 50 mol %, or typically at least 1 mol % and up to and including 20 mol %, based on the total recurring units in the (a) reactive polymer.

The mol % amounts of the various recurring units defined herein for the (a) reactive polymers are meant to refer to the actual molar amounts present in the (a) reactive polymers. It is understood by one skilled in the art that the actual mol % values may differ from those theoretically possible from the amount of ethylenically unsaturated polymerizable monomers that are used in the polymerization procedure. However, under most polymerization conditions that allow high polymer yield and optimal reaction of all monomers, the actual mol % of each monomer is generally within ±15 mol % of the theoretical amounts.

In such (a) reactive polymers, the relative molar amounts of -A- and -B- recurring units can be adjusted and optimized using routine experimentation so that the polymeric layers used in the methods of this invention will provide satisfactory patterns and will not dissolve in the various solutions used in the electrolessly plating methods.

Particularly useful embodiments of (a) reactive polymers include but are not limited to (molar ratios are theoretical or nominal and based on amounts of monomers added to polymerization reaction solution):

poly(t-butoxycarbonyloxystyrene);
poly(t-butoxycarbonyloxyphenyl methacrylate);
poly(t-butoxycarbonyl 4-aminophenyl methacrylate);
poly(t-butoxycarbonyl 4-aminophenyl acrylate);
poly(t-butoxycarbonyl ester-4-aminophenyl methacrylate-co-n-butyl methacrylate) (80:20), (98:2), or (90:10);
poly(t-butoxycarbonyl ester-4-aminophenyl methacrylate-co-n-butyl acrylate) (80:20), (98:2), or (90:10);
poly(t-butoxycarbonyl ester-4-aminophenyl methacrylate-co-n-butyl acrylate-co-benzyl methacrylate) (96:2:2), (90:8:2), or (80:10:10); and poly(t-butoxycarbonyl ester-4-aminophenyl methacrylate-co-n-butyl acrylate-co-styrene) (96:2:2), (90:8:2), or (80:10:10).

The (a) reactive polymers generally have a molecular weight ($M_w$) of at least 10,000 and up to and including 500,000 as measured by gel permeation chromatography (GPC) or by size exclusion chromatography (SEC).

Examples of (a) reactive polymers can be prepared using known free radical solution polymerization techniques using known starting materials, free radical initiators, and reaction conditions in suitable organic solvents such as tetrahydrofuran that can be adapted from known polymer chemistry. Where starting materials (such as ethylenically unsaturated polymerizable monomers) are not available commercially, such starting materials can be synthesized using known chemical starting materials and procedures.

Representative preparations of particularly useful (a) reactive polymer embodiments are provided below for use in the Invention Examples described below.

Reactive Compositions:

The (a) reactive polymers described herein can be used in reactive compositions in polymeric layers in various methods for forming conductive patterns for example using electroless plating.

Each of these reactive compositions has only two essential components: the (a) reactive polymer described above, and a (b) compound that provides an acid upon exposure to radiation having a $\lambda_{max}$ of at least 150 nm and up to and including 450 nm, as described below. While various optional components can be included as described below, only these two essential components are needed for providing the desired pattern in the reactive composition forming the polymeric layer.

One or more (a) reactive polymers as described above are generally present in the reactive composition (and in the resulting dry polymeric layer) in an amount of at least 50 weight % and up to and including 99.5 weight %, or typically at least 80 weight % and up to and including 95 weight %, based on the total solids in the reactive composition (or dry polymeric layer weight).

The (b) compounds used in the present invention provide a cleaving acid having a pKa of less than 2 or typically a pKa less than 0, as measured in water, during the noted exposure to radiation. The (b) compounds generally absorb radiation having a $\lambda_{max}$ of at least 150 nm and up to and including 450 nm, or typically radiation having a $\lambda_{max}$ of at least 150 nm and up to and including 330 nm. Upon such exposure, the (b) compound cleaves the tertiary alkyl ester groups in the (a) reactive polymer and leaves pendant arylene-XH groups and promotes crosslinking within the (a) reactive polymer.

Particularly useful (b) compounds are onium salts that decompose upon irradiation. An onium salt (also known as an onium compound) is a compound that is formed by the attachment of a proton to a mononuclear parent hydride of a Group 15 element (for example nitrogen and phosphorus), a chalcogen of Group 16 (for example sulfur and selenium), or a halogen (such as fluorine, bromine, chlorine, and iodine). Particularly useful (b) compounds include but are not limited to, onium salts such as sulfonium salts, phosphonium salts, iodonium salts, aryldiazonium salts, and other acid-generating compounds such as nitrobenzyl esters as described for example in U.S. Pat. No. 5,200,544 (Houlihan et al.) and oximes of sulfonates as described in U.S. Pat. No. 7,749,677 (Ando). The sulfonium salts, phosphonium salts, and iodonium salts are particularly useful, including but not limited to the arylsulfonium salts and aryliodonium salts that can provide an acid having a pKa less than 2, or even less than 0, as measured in water.

Useful onium salts have substituted aryl groups and strong acid anions such as hexafluorophosphate, tetrafluoroborate, hexofluoroarsenate, hexafluoroantimonate, and trifluoromethylsulfonate (triflate). Representative examples of useful onium salts include triarylsulfonium and biaryl iodonium salts such as triphenylsulfonium triflate, (4-methylphenyl) diphenylsulfonium triflate, (4-t-butylphenyl)diphenylsulfonium triflate, 4-methoxyphenyl)diphenylsulfonium triflate, and bis(4-t-butylphenyl)iodonium triflate.

One or more (b) compounds described herein are generally present in the reactive composition (and dry polymeric layer) in an amount of at least 0.5 weight % and up to and including 40 weight %, or more likely at least 2 weight % and up to and including 20 weight %, based on the total solids in the reactive composition (or dry polymeric layer weight).

The reactive compositions do not purposely include separate crosslinking agents as the (a) reactive polymer can provide crosslinking sites.

While not essential, it can be highly desirable to enhance the sensitivity of some (b) compounds to longer wavelengths (for example, greater than 300 nm) by including one or more (c) photosensitizers in the reactive composition used in this invention. A variety of photosensitizers are known in the art such as aromatic tertiary amines, aromatic tertiary diamines and certain aromatic polycyclic compounds such as substituted or unsubstituted anthracene compounds, as described for example in U.S. Pat. No. 4,069,054 (Smith) and U.S. Pat. No. 7,537,452 (Dede et al.). Particularly useful photosensitizers include unsubstituted anthracene and substituted anthracenes such as 9,10-diethoxyanthracene and 2-t-butyl-9,10-diethoxyanthracene.

One or more photosensitizers can be optionally present in the reactive composition (and dry polymeric layer) in an amount of at least 1 weight % and up to and including 30 weight %, or more likely at least 5 weight % and up to and including 15 weight %, based on the total solids in the reactive composition (or dry polymeric layer weight).

The reactive compositions can optionally include one or more addenda such as film-forming compounds, surfactants, plasticizers, filter dyes, viscosity modifiers, high boiling solvents that are compatible with the (a) reactive polymer (such as phthalated esters including dibutyl phthalate and dioctyl phthalate) and any other optional components that would be readily apparent to one skilled in the art, and such addenda can be present in amounts that would also be readily apparent to one skilled in the art.

The essential (a) reactive polymer and (b) compound, and the optional (c) photosensitizer described above are generally dissolved in a suitable organic solvent (or mixture of organic solvents) to form a reactive composition that can be applied to a suitable substrate (described below). Useful organic solvents include but are not limited to, ketones such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

Articles

The reactive composition described above can be applied to a suitable substrate using any suitable method including but not limited to, spin coating, bead coating, blade coating, curtain coating, or spray coating, from a suitable reservoir to form a polymeric layer. Useful substrates can be chosen for particular use or method as long as the substrate material will not be degraded by the reactive composition or any treatments to which the resulting precursor articles are subjected during the methods of this invention. The reactive composition can be applied multiple times if desired to obtain a thicker coating (reactive layer) of the reactive composition, and dried between each coating or dried only after the last application. Solvent can be removed from the reactive composition using any suitable drying technique.

In general the final dry coating of reactive composition can have an average dry thickness of at least 10 nm and up to and including 10 mm, with a dry thickness of at least 0.1 µm and up to and including 100 µm being more useful. The average dry thickness can be determined by measuring the dry layer thickness in at least 10 different places within a 10 cm by 10 cm square of the dry reactive layer using an electron microscope or other suitable diagnostic device.

Thus, useful substrates can be composed of glass, quartz, and ceramics as well as a wide variety of flexible materials such as cellulosic papers and polyesters including poly(ethylene terephthalate) and poly(ethylene naphthalate), polycarbonates, polyamides, poly(meth)acrylates, and polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 µm and up to and including 10 mm, depending upon the intended use of the resulting articles.

Particularly useful substrates are composed of poly(ethylene terephthalate) such as biaxially oriented poly(ethylene terephthalate) (PET) films that have broad uses in the electronics market. These PET films, ranging in dry thickness of at least 50 µm and up to and including 200 µm, can also comprise, on at least one side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 µm and up to and including 1 µm.

Thus, with the application of the described reactive composition to a suitable substrate, with or without appropriate drying, the present invention provides a precursor article comprising a substrate and having disposed thereon a polymeric layer comprising:

(a) a reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer Uses of Reactive Compositions The reactive compositions described herein can be used to form surface patterns for various purposes as described above. The following discussion provides some details about representative electroless plating methods in which the reactive compositions can be used.

In these electroless plating methods, each aqueous-based "processing" solution, dispersion, or bath (for example, solutions containing electroless seed metal ions, reducing agent solutions, and solutions for electroless plating, as well as rinsing solutions) used at various points can be specifically designed with essential components as well as optional addenda that would be readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives. The aqueous-based reducing solutions can also include suitable antioxidants.

Electroless Plating Method 1:

The method of this invention for forming a pattern in a polymeric layer, comprises:

providing a polymeric layer (as in forming the described precursor article), the polymeric layer comprising the reactive composition described above, including (a) reactive polymer, (b) compound that provides a cleaving acid, and (c) optionally photosensitizer, all as described above. This polymeric layer can be formed on a suitable substrate, if desired, as described above by suitable application of the reactive composition, after which the reactive composition is typically dried before the resulting article is used in the method of this invention.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and exposed regions comprising a polymer comprising pendant -arylene-XH groups. This exposure can be provided with any suitable exposing source or device that provides the desired radiation including but not limited to, various arc lamps and LED sources. The particular exposing source can be chosen depending upon the absorption characteristics of the chosen reactive composition. The exposing radiation can be projected through lenses or a lens or mask element that can be in physical contact or in proximity with the outer surface of the polymeric layer. Exposure time can range from a fraction (0.1) of a second and up to and including 10 minutes depending upon the intensity of the radiation source and the reactive composition. Suitable masks can be obtained by known methods including but not limited to photolithographic methods, flexographic methods, or vacuum deposition of a chrome mask onto a suitable substrate such as quartz or high quality optical glass followed by photolithographic patterning.

It is optional but desirable to heat or bake the polymeric layer in the precursor article simultaneously with or after the patternwise exposure but generally before contacting the exposed polymeric layer with electroless seed metal ions (described below). In most embodiments, this heating is carried out at least after the patternwise exposure of the polymeric layer, but it can be carried out both during and after the patternwise exposure of the polymeric layer. The heating is generally at a temperature in the range of or exceeding the glass transition temperature of the polymeric layer [that is similar to or the same as the glass transition temperature of the (a) reactive polymer]. Such heating can be accomplished on a hot plate with vacuum suction to hold the precursor article in close contact with the heating surface. Alternatively, the heating device can be a convection oven. The glass transition temperatures of the (a) reactive polymers useful in the practice of this invention can generally range from at least 50° C. and up to and including 180° C. Thus, polymeric layer can be heated at a temperature of less than 200° C. particularly if a plasticizer is present in the reactive composition. The duration of the heating procedure is generally less than 10 minutes with heating for least 10 seconds and up to and including 5 minutes being most likely. After the heating procedure, a faint image may be observable in the exposed regions of the polymeric layer due to the change in the index of refraction or physical contraction or expansion of the chemically altered (a) reactive polymer. The optimal heating time and temperature can be readily determined with routine experimentation depending upon the particular reactive composition.

The polymeric layer is generally hydrophilic in the exposed regions while still being hydrophobic in the non-exposed regions such that immersion in aqueous-based solutions (described below) will allow the aqueous molecules, ions, or reagent molecules to rapidly diffuse into the exposed regions.

At any time after the patternwise exposing or optional heating procedures, the reactive composition remaining in the non-exposed regions of the polymeric layer can be removed using an organic solvent in which the polymeric layer comprising the reactive composition is soluble or dispersible. In such procedures at least 50 weight % and typically at least 80 weight % or even at least 90 weight % of the reactive composition in the polymeric layer is removed from the non-exposed regions, based on the total amount of reactive composition originally present in those non-exposed regions. Upon this removal of reactive composition from the non-exposed regions of the polymeric layer, the various articles described herein will contain de-blocked and crosslinked polymer in the exposed regions of the polymeric layer, along with reducing agent molecules, electroless seed metal ions, electroless seed metal nuclei, or electroless plated metal, depending upon the stage at which the non-exposed reactive composition has been removed.

The removal procedure can be carried out in any suitable manner, including immersion of the intermediate article into a suitable organic solvent or mixture of organic solvents or by spraying the organic solvent or mixture of organic solvents onto the intermediate article surface. Contact with the organic solvent (or mixture thereof) can be carried out for a suitable time and temperature so that reactive composition is desirably removed in the non-exposed regions but little removal (less than 10 weight % of the total material) occurs in the exposed regions containing the de-blocked and crosslinked polymer derived from the (a) reactive polymer. For example, the contact time can be at least 10 seconds and up to and including 10 minutes, and the contact temperature can be at room temperature (about 20° C.) and up to and including 50° C.

Organic solvents that can used for this purpose include but are not limited to, ketones such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer derived from the (a) reactive polymer in the reactive composition described herein, and the non-exposed regions of the polymeric layer comprise little or no reactive composition.

Once patternwise exposure and optional heating have been carried out, the exposed regions of the polymeric layer are contacted with an aqueous-based solution or dispersion of electroless seed metal ions to form a pattern of electroless seed metal ions in the exposed regions of the polymeric layer. There are various ways that this contacting can be carried out. Typically, the entire article is immersed within a dilute aqueous-based solution, bath, or dispersion of the electroless seed metal ions for a sufficient time to coordinate the optimum number of electroless seed metal ions within the polymeric layer. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given polymeric layer and electroless seed metal ions that are to be used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but are not limited to, metal salts and metal-ligand complexes of nitrates, halides, acetates, cyanides, amines, nitrites, thiocyanates, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising exposed regions and non-exposed regions, the exposed regions comprising a pattern of electroless seed metal ions within the de-blocked and crosslinked polymer resulting from the irradiation of the reactive composition described herein, and the non-exposed regions comprising the reactive composition described herein comprising (a) reactive polymer, (b) a compound that provides a cleaving acid, and (c) optionally, a photosensitizer, all as described above.

After the requisite time to react the electroless seed metal ions within the de-blocked and crosslinked polymer in the exposed regions, the polymeric layer can be rinsed with distilled or deionized water or another aqueous-based solution for a suitable time and at a suitable temperature, for example usually room temperature or slightly higher.

Optionally at this point, the reactive composition can be removed from the non-exposed regions of the polymeric layer as described above, leaving the pattern of electroless seed metal ions with de-blocked and crosslinked polymer in the exposed regions of the polymeric layer.

If this removal procedure is carried out, an intermediate article is created, which intermediate article comprises a substrate and having disposed thereon exposed regions of the polymeric layer containing de-blocked and crosslinked polymer, and non-exposed regions of the polymeric layer comprising little or no reactive composition, wherein the exposed regions further comprise a pattern of electroless seed metal ions coordinated within the de-blocked and crosslinked polymer.

After forming a pattern of electroless seed metal ions, the electroless seed metal ions are then reduced to provide the corresponding coordinated electroless seed metal nuclei in the exposed regions of the polymeric layer. This can be done by contacting the polymeric layer (or at least the exposed regions) with a suitable reducing agent for the electroless seed metal ions. For example, the article comprising the polymeric layer can be immersed within an aqueous-based reducing solution containing one or more reducing agents for a suitable time to cause sufficient electroless metal ion reduction. Alternatively, an aqueous-based reducing solution comprising the reducing agent can be sprayed or rolled uniformly onto the polymeric layer.

Useful reducing agents include but are not limited to, an organic borane, an aldehyde such as formaldehyde, aldehyde sugar, hydroquinone, or sugar (or polysaccharide) such as ascorbic acid, and metal ions such as tin(II). These reducing agents can be used individually or in combination, and the total amount in the aqueous-based reducing solution used for the reducing procedure can be at least 0.01 weight % and up to and including 20 weight % based on the total reducing solution weight. The amount to be used will depend upon the particular electroless seed metal ions and reducing agent to be used, and this can be readily optimized using routine experimentation. The time and temperature for the reduction can also be readily optimized in the same manner. Generally, the reducing temperature is at least room temperature (about 20°) and up to and including 99° C. and the reducing time can be for at least 1 second and up to and including 30 minutes.

For example, some embodiments of the present invention can be carried out using an immersion bath comprising 1 solution weight % of an organic borane such as dimethylamine borane (DMAB) at room temperature for up to 3 minutes. Longer or shorter times at higher temperatures are possible if needed.

After this reducing procedure, the polymeric layer, especially the exposed regions, can be again washed using distilled water or deionized water, or another aqueous-based solution at a solution temperature for a suitable time.

At this point, the method of this invention has provided yet another intermediate article, comprising a substrate and having disposed thereon a polymeric layer comprising exposed regions and non-exposed regions, the exposed regions comprising a pattern of electroless seed metal nuclei within the de-blocked and crosslinked polymer resulting from the irradiation of the (a) reactive polymer in the reactive composition described herein, and the non-exposed regions comprising the reactive composition described herein comprising (a) reactive polymer, (b) a compound that provides a cleaving acid, and (c) optionally a photosensitizes, all as described above.

Optionally, the reactive composition in the non-exposed regions of the polymeric layer can be removed (as described above) after this reducing procedure. This would produce yet another intermediate article that would comprise exposed regions in the polymeric layer comprising a pattern of corresponding electroless seed metal nuclei within the de-blocked and crosslinked polymer resulting from irradiation, but comprise little or no reactive composition in the non-exposed regions of the polymeric layer.

This intermediate article can be immediately immersed in an aqueous-based electroless metal plating bath or solution, or the intermediate article can be stored with just the catalytic pattern comprising corresponding electroless seed metal nuclei for use at a later time.

The intermediate article can be contacted with an electroless plating metal that is the same as or different from the corresponding electroless seed metal nuclei. In most embodiments, the electroless plating metal is a metal different from the corresponding electroless seed metal nuclei.

Any metal that will likely electrolessly "plate" on the corresponding electroless seed metal nuclei can be used at this point, but in most embodiments, the electroless plating metal can be for example copper(II), silver(I), gold(IV), platinum (II), nickel(II), chromium(II), and combinations thereof. Copper(II), silver(I), and nickel(II) are particularly useful electroless plating metals.

The one or more electroless plating metals can be present in the aqueous-based electroless plating bath or solution in an amount of at least 0.01 weight % and up to and including 20 weight %, based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several second and up to several hours depending upon the desired deposition rate and plating metal thickness.

Other useful aqueous-based electroless plating solutions or baths comprise silver(I) with EDTA and sodium tartrate; silver(I) with ammonia and glucose; copper(II) with EDTA and dimethylaminoborane; copper(II) with citrate and hypophosphite; nickel(II) with lactic acid, acetic acid, and hypophosphite; and other industry standard electroless baths such as those described by Mallory et al. in *Electroless Plating: Fundamentals and Applications*, 1990.

After the electroless plating procedure, a product article is removed from the aqueous-based electroless plating bath or solution and can again be washed using distilled water or deionized water or another aqueous-based solution to remove any residual electroless plating chemistry or onium salts. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising corresponding electroless seed metal nuclei (for example, in a pattern) that have been electrolessly plated (for example in a pattern) with the same or different metal in the de-blocked and crosslinked polymer derived from the (a) reactive polymer described herein, and the non-exposed regions comprising a reactive composition as described herein comprising (a) reactive polymer, (b) compound that provides a cleaving acid, and (c) optionally a photosensitizer, all as described above.

Optionally at this point, the reactive composition can be removed from the non-exposed regions of the polymeric layer after electrolessly plating the corresponding electroless seed metal nuclei so that the resulting product article comprises a pattern of electrolessly plated metal in the exposed regions of the polymeric layer comprising the de-blocked and crosslinked polymer resulting from irradiation of the (a) reactive polymer described herein, but it comprises little or no reactive composition in the non-exposed regions of the polymeric layer.

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with a seed metal catalyst in an aqueous-based seed metal catalyst solution to facilitate deposition of additional metals.

After the electroplating procedure described above, the product article is removed from the electroless plating bath and can be further treated to decompose any residual onium salt on the polymeric layer or to change the visual characteristics and or durability of the electrolessly plated metal. For example, to decompose any remaining onium salt or other cleaving acid-generating (b) compound, the polymeric film can be uniformly exposed or blanket flashed with ultraviolet radiation and baked (or heated) similarly as described above after the initial exposure.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments, the treatment conditions can be the same or different.

In addition, multiple treatments with an aqueous-based reducing solution or aqueous-based seed metal catalyst solution can be carried out in sequence, using the same or different conditions. Sequential washing or rinsing steps can also be carried out where appropriate.

Further, the electroless plating procedures can be carried out multiple times, in sequence, using the same or different electroless plating metal and the same or different electroless plating conditions and times.

It is also possible to use the article provided by this method that comprises the noted pattern of an electrolessly plated metal, to incorporate a second or more patterns in the non-exposed regions. This can be accomplished by subjecting this product article to the same sequence of procedures or steps using the same or different reagents and aqueous-based solutions to provide at least a second pattern in what would be considered second exposed regions since the electrolessly plated metal would be in what is considered the first exposed regions. The second exposed regions can comprise all of the original non-exposed regions, or they can comprise only some of the non-exposed regions. For example, to create a second pattern in the product article having the electrolessly plated metal, the article can be treated or processed as follows, using conditions and aqueous-based solutions similar to or the same as those described above:

a) patternwise exposing the previously non-exposed regions to form second exposed regions in the polymeric layer, b) optionally heating the polymeric layer, c) contacting at least the second exposed regions with an aqueous-based solution containing electroless seed metal ions, and optionally rinsing, d) reducing the coordinated electroless seed metal ions with an aqueous-based reducing solution, and optionally rinsing, and e) electrolessly plating the same or different metal in the second exposed regions.

Electroless Plating Method 2:

Moreover, another method for forming a pattern in a polymeric layer comprises:

providing a polymeric layer (as in forming the described precursor article), the polymeric layer comprising a reactive composition as described above, comprising (a) reactive polymer, (b) compound that provides a cleaving acid, and (c) optionally, a photosensitizer, all as described above. This polymeric layer can be formed on a suitable substrate, if desired, as described above by suitable application of the reactive composition, after which the reactive composition is typically dried before the resulting article is used in the method of this invention.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and exposed regions comprising a polymer comprising pendant -arylene-XH groups. This exposure can be provided with any suitable exposing source or device that provides the desired radiation including but not limited to, various arc lamps and LED sources. The particular exposing source can be chosen depending upon the absorption characteristics of the particular reactive composition used. The exposing radiation can be projected through a lens or mask element that can be in physical contact or in proximity with (not in physical contact) the outer surface of the polymeric layer. Exposure time can range from a fraction (0.1) of a second and up to and including 10 minutes depending upon the intensity of the radiation source and the reactive compositions. Suitable masks can be obtained by known methods including but not limited to photolithographic methods, flexographic methods, or vacuum deposition of a chrome mask onto a suitable substrate such as quartz or high quality optical glass followed by photolithographic patterning.

It is optional but desirable to heat or bake the reactive composition in the precursor article simultaneously with or after the patternwise exposure but generally before contacting the exposed polymeric layer with the aqueous-based reducing solution (described below). In most embodiments, this heating is carried out at least after the patternwise exposure of the polymeric layer, but it can be carried out both during and after the patternwise exposure of the polymeric layer. The heating is generally at a temperature in the range of or exceeding the glass transition temperature of the polymeric layer [that is similar to or the same as the glass transition temperature of the (a) reactive polymer]. Such heating can be accomplished on a hot plate with vacuum suction to hold the precursor article in close contact with the heating surface. Alternatively, the heating device can be a convection oven. The glass transition temperatures of the reactive polymers of this invention can generally range from at least 50° C. and up to and including 180° C. Thus, the polymeric layer can be heated at a temperature of less than 200° C. particularly when a plasticizer is included in the reactive composition. The duration of the heating procedure is generally less than 10 minutes with heating for least 10 seconds and up to and including 2 minutes being most likely. After the heating procedure, a faint image may be observable in the exposed regions of the polymeric layer due to the change in the index of refraction or physical contraction or expansion of the chemically altered reactive polymer. The optimal heating time and temperature can be readily determined using routine experimentation with a particular reactive composition.

The polymeric layer is generally hydrophilic in the exposed regions while still being hydrophobic in the non-exposed regions such that immersion in aqueous-based solutions (described below) will allow the aqueous molecules, ions, or reagents to rapidly diffuse into the exposed regions.

At any time after the patternwise exposing or optional heating procedures, the reactive composition in the non-exposed regions of the polymeric layer can be removed using an organic solvent in which the polymeric layer comprising the reactive composition is soluble or dispersible. In such procedures at least 50 weight % and typically at least 80 weight % or even at least 90 weight % of the polymeric layer is removed in the non-exposed regions, based on the total amount of reactive composition originally present in the non-exposed regions of the polymeric layer. Upon this removal of reactive composition from the non-exposed regions of the polymeric layer, the various articles described herein will contain de-blocked and crosslinked polymer in the exposed regions of the polymeric layer, along with reducing agent molecules, electroless seed metal ions, electroless seed metal nuclei, or electroless plated metal, depending upon the stage at which the non-exposed reactive composition has been removed.

The removal procedure can be carried out in any suitable manner, including immersion of the intermediate article into a suitable organic solvent or mixture of organic solvents or by spraying the organic solvent or mixture of organic solvents onto the intermediate article surface. Contact with the organic solvent (or mixture thereof) can be carried out for a suitable time and temperature so that polymeric layer is desirably removed in the non-exposed regions but little removal (less than 10 weight % of the total material) occurs in the exposed regions of the polymeric layer containing the de-blocked and crosslinked polymer. For example, the contact time can be at least 10 seconds and up to and including 10 minutes, and the contact temperature can be at room temperature (about 20° C.) and up to and including 50° C.

Organic solvents that can used for this purpose include but are not limited to, ketones such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer derived from the (a) reactive polymer in the reactive composition as described herein, and the non-exposed regions of the polymeric layer comprise little or no reactive composition.

After the exposure and optional heating, the exposed regions of the polymeric layer are contacted with an aqueous-based reducing solution containing one or more reducing agents. In the exposed regions, the reducing agent can diffuse into the de-blocked and crosslinked polymer provided during irradiation or the reactive composition described herein. In the non-exposed regions, the reducing agent does not readily diffuse into or attach to the (a) reactive polymer.

This contact can be accomplished by contacting the polymeric layer with a suitable reducing agent for the electroless seed metal ions. For example, the article comprising the polymeric layer can be immersed within the aqueous-based reducing solution containing one or more reducing agents for a suitable time to allow diffusion of the reducing agent into the exposed regions. Alternatively, the aqueous-based solution comprising the reducing agent can be sprayed or rolled uniformly onto the polymeric layer.

Useful reducing agents include but are not limited to, an organic borane, an aldehyde such as formaldehyde, aldehyde sugar, hydroquinone, or sugar (or polysaccharide) such as ascorbic acid, and metal ions such as tin(II). These reducing agents can be used individually or in combination, and the total amount in the aqueous-based reducing solution used for the reducing procedure can be at least 0.01 weight % and up to and including 20 weight % based on total aqueous-based solution weight. The amount can be readily optimized using routine experimentation. The time and temperature can also be readily optimized in the same manner. Generally, the reducing temperature is at least room temperature (about 20° C.) and up to and including 99° C. and the reducing time can be for at least 1 second and up to and including 30 minutes.

For example, some embodiments of the present invention can be carried out using an immersion bath comprising 1 solution weight % of an organic borane such as dimethylamine borane (DMAB) at room temperature for up to 3 minutes. Longer or shorter times at higher temperatures are possible if needed.

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising a pattern of a de-blocked and crosslinked polymer derived from the (a) reactive polymer in the reactive composition described herein, and comprising reducing agent dispersed within the de-blocked and de-blocked and crosslinked polymer, and the non-exposed regions comprising a reactive composition as described above comprising (a) reactive polymer, (b) compound that provides an acid, and (c) optionally a photosensitizer, all as described above.

Optionally at this point, the reactive composition in the non-exposed regions of the polymeric layer can be removed from the substrate as described above, leaving the reducing agent diffused into the de-blocked and de-blocked and crosslinked polymer in the exposed regions of the polymeric layer.

If this procedure is carried out, an intermediate article is created, which intermediate article comprises a substrate and having disposed thereon exposed regions of the polymeric layer containing de-blocked and crosslinked polymer, and non-exposed regions of the polymeric layer comprising little or no reactive composition, wherein the exposed regions further comprise a reducing agent diffused within the de-blocked and crosslinked polymer.

Once the patternwise exposure, optional heating, and contacting with the reducing agent have been carried out, the exposed regions of the polymeric layer can be contacted with an aqueous-based solution or dispersion of electroless seed metal ions to form electroless seed metal nuclei in the exposed regions of the polymeric layer. These electroless seed metal nuclei form catalytic sites for electroless metal plating (deposition of metal) described below. There are various ways that this contacting can be carried out. Typically, the entire article and polymeric layer are immersed within a dilute aqueous-based solution, bath, or dispersion of the electroless seed metal ions for a sufficient time to coordinate the optimum number of electroless seed metal nuclei within the exposed regions of the polymeric layer. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given polymeric layer and electroless seed metal ions that are used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but not limited to, metal salts and metal-ligand complexes of nitrates, halides, acetates, cyanides, amines, nitriles, thiocyanates, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising exposed regions and non-exposed regions, the exposed regions comprising a pattern of electroless seed metal nuclei within the de-blocked and crosslinked polymer resulting from the irradiation of the (a) reactive polymer in the reactive composition described herein, and the non-exposed regions comprising the reactive composition as described above comprising (a) reactive polymer, (b) compound that provides an acid, and (c) optionally a photosensitizer, all as described above.

After the requisite time to react within the resulting de-blocked and crosslinked polymer in the exposed regions, the polymeric layer can be rinsed with distilled or deionized water or other aqueous-based solution for a suitable time and at a suitable temperature, usually room temperature or slightly higher.

Optionally at this point, the reactive composition can be removed from the substrate in the non-exposed regions of the polymeric layer as described above, leaving the pattern of electroless seed metal nuclei in the exposed regions of the polymeric layer.

If this procedure is carried out, an intermediate article is created, which intermediate article comprises a substrate and having disposed thereon exposed regions of the polymeric layer containing de-blocked and crosslinked polymer, non-exposed regions of the polymeric layer comprising little or no reactive composition, wherein the exposed regions further comprise a pattern of electroless seed metal nuclei.

The resulting intermediate article can be immediately immersed in an aqueous-based electroless plating bath or solution or the immediate article can be stored with the catalytic pattern comprising corresponding electroless seed metal nuclei for use at a later time.

The intermediate article can be contacted with an electroless plating metal that is the same as or different from the corresponding electroless seed metal nuclei. In most embodiments, the electroless plating metal is a metal different from the corresponding electroless seed metal nuclei.

Any metal that will likely electrolessly "plate" on the corresponding electroless seed metal nuclei can be used at this point, but in most embodiments, the electroless plating metal can be for example copper(II), silver(I), gold(IV), palladium (II), platinum(II), nickel(II), chromium(II), and combinations thereof. Copper(II), silver(I), and nickel(II) are particularly useful electroless plating metals.

The one or more electroless plating metals can be present in an aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several second and up to several hours depending upon the desired deposition rate and plating metal thickness.

Other useful aqueous-based electroless plating solutions or baths comprise silver(I) with EDTA and sodium tartrate; silver(I) with ammonia and glucose; copper(II) with EDTA and dimethylamineborane; copper(II) with citrate and hypophosphite; nickel(II) with lactic acid, acetic acid, and hypophosphite; and other industry standard electroless baths such as those described by Malloy et al. in *Electroless Plating: Fundamentals and Applications* 1990.

After the electroless plating procedure, a product article is removed from the aqueous-based electroless plating bath and can again be washed using distilled water or deionized water or another aqueous-based solution to remove any residual electroless plating chemistry or onium salts. At this point, the polymeric layer and electrolessly plated metal are generally stable and can be used for their intended purpose.

Optionally at this point, the reactive composition can be removed from the non-exposed regions of the polymeric layer after electrolessly plating the corresponding electroless seed metal nuclei so that the resulting product article comprises a pattern of electrolessly plated metal in the exposed regions of the polymeric layer containing the de-blocked and crosslinked polymer, but the resulting product article comprises little or no reactive composition in the non-exposed regions of the polymeric layer.

To change the surface of the electroless plated metal for visual or durability reasons, it is possible that a variety of treatments can be employed including surface plating of still another (third) metal such as nickel or silver on the "second" electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, is may be desirable to treat the electrolessly plated metal with a seed metal catalyst in an aqueous-based seed metal catalyst solution to facilitate deposition of additional metals.

Alternatively, the resulting product article can undergo further treatment to decompose any residual onium salt on the polymeric layer or to change the visual characteristics and or durability of the electrolessly plated metal. For example, to decompose any remaining onium salt or other acid-generating (b) compound, the polymeric film can be uniformly exposed or blanket flashed with ultraviolet radiation and baked (or heated) similarly as described above after the initial exposure.

Thus, this method provides a product article comprising a substrate and having disposed thereon a polymeric layer comprising exposed regions and non-exposed regions, the exposed regions comprising a pattern of an electroless seed metal nuclei (for example, in a pattern) that have been electrolessly plated with the same or different metal, and de-blocked and crosslinked polymer resulting from irradiation of the (a) reactive polymer in the reactive composition described above, and the non-exposed regions comprising a reactive composition as described herein comprising (a) a reactive polymer, (b) compound that provides an acid, and (c) optionally a photosensitizer, all as described above.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments, the treatment conditions can be the same or different.

In addition, multiple treatments with an aqueous-based reducing solution or aqueous-based seed metal catalyst solution can be carried out in sequence, using the same or different conditions. Sequential washing or rinsing steps can also be carried out where appropriate.

Further, the electroless plating procedures can be carried out multiple times, in sequence, using the same or different electroless plating metal and the same or different electroless plating conditions and times.

It is also possible to use the product article comprising the noted pattern of an electrolessly plated metal to incorporate a second or more patterns in the non-exposed regions. This can be accomplished by subjecting this product article to the same sequence of procedures or steps using the same or different reagents and aqueous-based solutions to provide at least a second pattern in what would be considered second exposed regions since the electrolessly plated metal would be in what is considered the first exposed regions. The second exposed regions can comprise all of the original non-exposed regions, or they can comprise only some of the non-exposed regions. For example, to create a second pattern in the product article having the electrolessly plated metal, the product article can be treated or processed as follows, using conditions and aqueous-based solutions similar to or the same as those described above:

a) patternwise exposing the previously non-exposed regions to form second exposed regions in the polymeric layer, b) optionally heating the polymeric layer, c) contacting the second exposed regions with an aqueous-based reducing solution, and optionally rinsing, d) contacting at least the second exposed regions with an aqueous-based solution containing electroless seed metal ions, and optionally rinsing, and e) electrolessly plating the same or different metal in the second exposed regions.

Electroless Plating Method 3:

Moreover, still another method for forming a pattern in a polymeric layer, comprises:

providing a polymeric layer (as in forming the described precursor article), the polymeric layer comprising a reactive composition as described above, comprising (a) reactive polymer, (b) compound that provides a cleaving acid, and (c) optionally, a photosensitizer, all as described above. This polymeric layer can be formed on a suitable substrate, if desired, as described above by suitable application of the reactive composition, after which the reactive composition is typically dried before the resulting article is used in the method of this invention.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and exposed regions comprising a polymer comprising pendant -arylene-XH groups. This exposure can be provided with any suitable exposing source or device that provides the desired radiation including but not limited to, various arc lamps and LED sources. The particular exposing source can be chosen depending upon the absorption characteristics of the particular reactive composition. The exposing radiation can be projected through a lens or mask element that can be in physical contact or in proximity with (not in physical contact) the outer surface of the polymeric layer. Exposure time can range from a fraction (0.1) of a second and up to and including 10 minutes depending upon the intensity of the radiation source and the reactive composition. Suitable masks can be obtained by known methods including but not limited to photolithographic methods, flexographic methods, or vacuum deposition of a chrome mask onto a suitable substrate such as quartz or high quality optical glass followed by photolithographic patterning.

It is optional but desirable to heat or bake the reactive composition in the precursor article simultaneously with or after the patternwise exposure but generally before contacting the exposed polymeric layer with electroless seed metal ions (described below). In most embodiments, this heating is carried out at least after the patternwise exposure of the polymeric layer, but it can be carried out both during and after the patternwise exposure of the polymeric layer. The heating is generally at a temperature in the range of or exceeding the glass transition temperature of the polymeric layer [that is similar to or the same as the glass transition temperature of the (a) reactive polymer]. Such heating can be accomplished on a hot plate with vacuum suction to hold the precursor article in close contact with the heating surface. Alternatively, the heating device can be a convection oven. The glass transition temperatures of the reactive polymers of this invention can generally range from at least 50° C. and up to and including 180° C. Thus, the polymeric layer can be heated at a temperature of less than 200° C. particularly when a plasticizer is present within the reactive composition. The duration of the heating procedure is generally less than 10 minutes with heating for least 10 seconds and up to and including 2 minutes being most likely. After the heating procedure, a faint image may be observable in the exposed regions of the polymeric layer due to the change in the index of refraction or physical contraction or expansion of the chemically altered reactive polymer. The optimal heating time and temperature can be readily determined using routine experimentation with a particular reactive composition.

The polymeric layer is generally hydrophilic in the exposed regions while still being hydrophobic in the non-exposed regions such that immersion in an aqueous-based reducing solution (described below) will allow the aqueous molecules, ions, or reagent molecules to rapidly diffuse into the exposed regions.

At any time after the patternwise exposing or optional heating procedures, the reactive composition remaining in the non-exposed regions of the polymeric layer can be removed using an organic solvent in which the polymeric layer comprising the reactive composition is soluble or dispersible. In such procedures at least 50 weight % and typically at least 80 weight % or even at least 90 weight % of the polymeric layer is removed in the non-exposed regions, based on the total amount or reactive composition originally present in the non-exposed regions of the polymeric layer. Upon this removal of reactive composition from the non-exposed regions of the polymeric layer, the various articles described herein will contain de-blocked and crosslinked polymer in the exposed regions of the polymeric layer, along with reducing agent molecules, electroless seed metal ions, electroless seed metal nuclei, or electroless plated metal, depending upon the stage at which the non-exposed reactive composition has been removed.

The removal procedure can be carried out in any suitable manner, including immersion of the intermediate article into a suitable organic solvent or mixture of organic solvents or by spraying the organic solvent or mixture of organic solvents onto the intermediate article surface. Contact with the organic solvent (or mixture thereof) can be carried out for a suitable time and temperature so that polymeric layer is desirably removed in the non-exposed regions but little removal (less than 10 weight % of the total material) occurs in the exposed regions of the polymeric layer containing the de-blocked and crosslinked polymer derived from the (a) reactive polymer in the reactive composition described herein. For example, the contact time can be at least 10 seconds and up to and including 10 minutes, and the contact temperature can be at room temperature (about 20° C.) and up to and including 50° C.

Organic solvents that can used for this purpose include but are not limited to ketones, such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

In many embodiments, removing the reactive composition from the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer derived from the (a) reactive polymer in the reactive composition described above, and the non-exposed regions of the polymeric layer comprise little or no reactive composition.

After the exposure and optional heating, the exposed regions of the polymeric layer are contacted with an aqueous-based reducing solution containing one or more suitable reducing agents. In the exposed regions, the reducing agent can diffuse into the de-blocked and crosslinked polymer. In the non-exposed regions, the reducing agent does not readily diffuse into the polymeric layer but will become attached to the surface of the polymeric layer.

This contact can be accomplished by contacting the polymeric layer with a suitable reducing agent for the electroless seed metal ions. For example, the article comprising the polymeric layer can be immersed within an aqueous-based reducing solution comprising the reducing agent for a suitable time to allow diffusion of the reducing agent into the exposed regions. Alternatively, the aqueous-based reducing solution comprising the reducing agent can be sprayed or rolled uniformly onto the polymeric layer.

Useful reducing agents include but are not limited to, an organic borane, an aldehyde such as formaldehyde, aldehyde sugar, hydroquinone, or sugar (or polysaccharide) such as ascorbic acid, and metal ions such as tin(II). These reducing agents can be used individually or in combination, and the total amount in the aqueous-based reducing solution used for the reducing procedure can be at least 0.01 weight % and up to and including 20 weight % based on total reducing solution weight. The amount can be readily optimized using routine experimentation. The time and temperature can also be readily optimized in the same manner. Generally, the reducing temperature is at least room temperature (about 20° C.) and up to and including 99° C. and the reducing time can be for at least 1 second and up to and including 30 minutes.

For example, some embodiments of the present invention can be carried out using an immersion bath comprising 3 solution weight % of stannous chloride dihydrate with 1 weight % hydrochloric acid at room temperature for up to 4 minutes. Longer or shorter times at higher temperatures are possible if needed.

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising a de-blocked and crosslinked polymer derived from the (a) reactive polymer in the reactive composition described above, into which a reducing agent has diffused, and the non-exposed regions comprising reducing agent attached to a reactive polymer in a reactive composition described above comprising (a) reactive polymer, (b) compound that provides an acid, and (c) optionally, a photosensitizes, all as described above.

Optionally at this point, the reactive composition in the non-exposed regions of the polymeric layer can be removed (as described above) after this reducing procedure and before the oxidizing procedure described below. This would produce yet another intermediate article that would comprise exposed regions in the polymeric layer comprising diffused reducing agent within the de-blocked and crosslinked polymer resulting from irradiation, but the non-exposed regions of the polymeric layer would comprise little or no reactive composition.

Once patternwise exposure, optional heating, and the reducing procedure have been carried out, the polymeric layer is contacted with an aqueous-based bleaching (or oxidizing) solution comprising one or more bleaching agents, thereby removing surface amounts of the reducing agent in both non-exposed and exposed regions of the polymeric layer. The term "bleaching" refers to oxidizing the reducing agent molecules to make them inactive for further reaction (thus, they cannot reduce the seedless metal ions when bleached).

Useful bleaching agents for this bleaching procedure can be chosen depending upon the reducing agent that is used in the previous operation. Representative bleaching agents include but are not limited to, peroxides such as hydrogen peroxide, persulfates, iron(III) complexes, and combinations thereof. Hydrogen peroxide is particularly useful. In general, the one or more bleaching agents are present in the aqueous-based bleaching solution in an amount of at least 0.01 weight % and up to and including 20 weight %, based on total aqueous-based bleaching solution weight.

In general, bleaching the polymeric layer is carried out in sufficient time and temperature so that the aqueous-based bleaching solution reacts with (deactivates) or removes at least 90 mol % (or typically at least 95 mol %) of the reducing agent in the non-exposed regions and less than 40 mol % (or typically less than 25 mol %) in the exposed regions of the polymeric layer. The useful time and temperature conditions needed to achieve these results would be readily determined with routine experimentation in view of the teaching provided herein.

At this point, the present invention provides an intermediate article, comprising a substrate and having disposed thereon a polymeric layer comprising exposed regions and non-exposed regions, the exposed regions comprising a pattern of non-oxidized reducing agent molecules within the de-blocked and crosslinked polymer resulting from the irradiation of the (a) reactive polymer in the reactive composition described herein, and the non-exposed regions comprising the reactive composition described herein comprising (a) reactive polymer, (b) a compound that provides an acid, and (c) optionally, a photosensitizer, all as described above.

Optionally, the reactive composition can be removed from the non-exposed regions of the polymeric layer as described above, leaving the partially oxidized reducing agent molecules in the exposed regions of the polymeric layer containing the de-blocked and crosslinked polymer derived from the (a) reactive polymer in the reactive composition described above.

If this procedure is carried out, an intermediate article is created that comprises a substrate and having disposed thereon exposed regions of the polymeric layer containing de-blocked and crosslinked polymer derived from the (a) reactive polymer in the reactive composition described herein, and non-exposed regions of the polymeric layer comprising little or no reactive composition, wherein the exposed regions further comprise partially oxidized reducing agent molecules within the de-blocked and crosslinked polymer.

Once the previous operations have been carried out, the exposed regions of the polymeric layer can be contacted with an aqueous-based solution or dispersion containing electroless seed metal ions to oxidize the reducing agent and to form corresponding electroless seed metal nuclei (for example in a pattern) in the exposed regions of the polymeric layer. These corresponding electroless seed metal nuclei form catalytic sites for electroless metal plating (deposition of metal) described below. There are various ways that this contacting can be carried out. Typically, the entire intermediate article and the polymeric layer are immersed within a dilute aqueous-based solution, bath, or dispersion of the electroless seed metal ions for a sufficient time to oxidize reducing agent and to coordinate within the exposed regions of the polymeric layer. For example, this contact with the electroless seed metal ions can be carried out for at least 1 second and up to and including 30 minutes, at room temperature (about 20° C.) or at a higher temperature of up to and including 99° C. The time and temperature for this contact can be optimized for a given polymeric layer and electroless seed metal ions using routine experimentation.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex. Useful materials of this type include but are not limited to, metal salts and metal-ligand complexes of nitrates, halides, acetates, cyanides, amines, nitriles, thiocyanates, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising exposed regions and non-exposed regions, the exposed regions comprising a pattern of corresponding electroless seed metal nuclei within the de-blocked and crosslinked polymer resulting from irradiation of the (a) reactive polymer in the reactive composition described herein, and the non-exposed regions comprising a reactive composition as described herein comprising (a) reactive polymer, (b) compound that provides an acid, and (c) optionally, a photosensitizer, all as described above.

After the requisite time to react the electroless seed metal ions within the resulting de-blocked and crosslinked polymer in the exposed regions, the polymeric layer can be rinsed with distilled or deionized water or another aqueous-based solution for a suitable time and at a suitable temperature, usually room temperature or slightly higher.

Optionally at this point, the reactive composition can be removed from the non-exposed regions of the polymeric layer as described above, leaving the pattern of electroless seed metal ions in the exposed regions of the polymeric layer.

If this procedure is carried out, an intermediate article is created that comprises a substrate and having disposed thereon exposed regions of the polymeric layer containing a de-blocked and crosslinked polymer derived from the (a) reactive polymer in the reactive composition, and non-exposed regions of the polymeric layer comprising little or no reactive composition, wherein the exposed regions further comprise a pattern of electroless seed metal ions coordinated within the de-blocked and crosslinked polymer.

The resulting intermediate article can be immediately immersed in an aqueous-based electroless plating bath or solution or it can be stored with just the catalytic pattern comprising electroless seed metal for use at a later time.

The article can be contacted with an electroless plating metal that is the same as or different from the electroless seed metal. In most embodiments, the electroless plating metal is a metal different from the corresponding electroless seed metal nuclei.

Any metal that will likely electrolessly "plate" on the corresponding electroless seed metal nuclei can be used at this point, but in most embodiments, the electroless plating metal can be for example copper(II), silver(I), gold(IV), palladium (II), platinum(II), nickel(II), chromium(II), and combinations thereof. Copper(II), silver(I), and nickel(II) are particularly useful electroless plating metals.

The one or more electroless plating metals can be present in an aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating metal thickness.

Other useful aqueous-based electroless plating solutions or baths comprise silver(I) with EDTA and sodium tartrate; silver(I) with ammonia and glucose; copper(II) with EDTA and dimethylamineborane; copper(II) with citrate and hypophosphite; nickel(II) with lactic acid, acetic acid, and hypophosphite; and other industry standard electroless baths such as those described by Malloy et al. in *Electroless Plating: Fundamentals and Applications* 1990.

After the electroless plating procedure, the product article is removed from the aqueous-based electroless plating bath and can again be washed using distilled water or deionized water or another aqueous-based solution to remove any residual electroless plating chemistry or onium salts. At this point, the polymeric layer and electrolessly plated metal are generally stable and can be used for their intended purpose.

Optionally at this point, the reactive composition can be removed from the non-exposed regions of the polymeric layer after electrolessly plating the corresponding electroless seed metal nuclei so that the resulting product article comprises a pattern of electrolessly plated metal in the exposed regions of the polymeric layer but the product article comprises little or no reactive composition in the non-exposed regions of the polymeric layer.

To change the surface of the electrolessly plated metal for visual or durability reasons, it is possible that a variety of treatments can be employed including surface electroless plating of still another (third) metal such as nickel or silver on the "second" electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, is may be desirable to treat the electrolessly plated metal with a seed metal catalyst in an aqueous-based seed metal catalyst solution to facilitate deposition of additional metals.

Alternatively, the resulting product article can undergo further treatment to decompose any residual onium salt on the polymeric layer or to change the visual characteristics and or durability of the electrolessly plated metal. For example, to decompose any remaining onium salt or other acid-generating (b) compound, the polymeric film can be uniformly exposed or blanket flashed with ultraviolet radiation and baked (or heated) similarly as described above after the initial exposure.

Thus, this method provides a product article comprising a substrate and having disposed thereon a polymeric layer comprising exposed regions and non-exposed regions, the exposed regions comprising a pattern of a corresponding electroless seed metal nuclei within the de-blocked and crosslinked polymer derived from the (a) reactive polymer in the reactive composition described herein, which has been electrolessly plated with the same or different metal, and the non-exposed regions comprising a reactive composition as described herein comprising (a) a reactive polymer, (b) compound that provides an acid, and (c) optionally, a photosensitizer, all as described above.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments, the treatment conditions can be the same or different.

In addition, multiple treatments with an aqueous-based reducing solution, aqueous-based bleaching solution, or aqueous-based seed metal catalyst solution can be carried out in sequence, using the same or different conditions. Sequential washing or rinsing steps can also be carried out where appropriate.

Further, the electroless plating procedures can be carried out multiple times, in sequence, using the same or different electroless plating metal and the same or different electroless plating conditions and times.

It is also possible to use this article comprising the noted pattern of an electrolessly plated metal to incorporate a second or more patterns in the non-exposed regions. This can be accomplished by subjecting this product article to the same sequence of procedures or steps using the same or different reagents and aqueous-based solutions to provide at least a second pattern in what would be considered second exposed regions since the electrolessly plated metal would be in what is considered the first exposed regions. The second exposed regions can comprise all of the original non-exposed regions, or they can comprise only some of the non-exposed regions.

For example, to create a second pattern in the product article having the electrolessly plated metal, the product article can be treated or processed as follows, using conditions and aqueous-based solutions similar to or the same as those described above:

a) patternwise exposing the previously non-exposed regions to form second exposed regions in the polymeric layer, b) optionally heating the polymeric layer, c) contacting the second exposed regions with an aqueous-based reducing solution, and optionally rinsing, d) contacting the second exposed regions with an aqueous-based bleaching (oxidizing) solution, and optionally rinsing, e) contacting at least the second exposed regions with an aqueous-based solution containing electroless seed metal ions, and optionally rinsing, and f) electrolessly plating the same or different metal in the second exposed regions.

Electroless Plating Method 4:

The method for forming a pattern in a polymeric layer comprises:

providing a polymeric layer (as in forming the described precursor article), the polymeric layer comprising the reactive composition described above, comprising (a) reactive polymer, (b) a compound that provides a cleaving acid, and (c) optionally, a photosensitizer, all as described above. This polymeric layer can be formed on a suitable substrate, if desired, as described above by suitable application of the reactive composition, after which the reactive composition is typically dried before the resulting article is used in the method of this invention.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and first exposed regions comprising a de-blocked and crosslinked polymer comprising pendant -arylene-XH groups. This exposure can be provided with any suitable exposing source or device that provides the desired radiation including but not limited to, various arc lamps and LED sources. The particular exposing source can be chosen depending upon the absorption characteristics of the particular reactive composition used. The exposing radiation can be projected through a lens or mask element that can be in physical contact or in proximity (not in physical contact) with the outer surface of the polymeric layer. Exposure time can range from a fraction (0.1) of a second and up to and including 10 minutes depending upon the intensity of the radiation source and the reactive compositions. Suitable masks can be obtained by known methods including but not limited to photolithographic methods, flexographic methods, or vacuum deposition of a chrome mask onto a suitable substrate such as quartz or high quality optical glass followed by photolithographic patterning.

It is optional but desirable to heat or bake the reactive composition in the precursor article simultaneously with or after the patternwise exposure but generally before contacting the exposed polymeric layer with electroless seed metal ions (described below). In most embodiments, this heating is carried out at least after the patternwise exposure of the polymeric layer, but it can be carried out both during and after the patternwise exposure of the polymeric layer. The heating is generally at a temperature in the range of or exceeding the glass transition temperature of the polymeric layer [that is similar to or the same as the glass transition temperature of the (a) reactive polymer]. Such heating can be accomplished on a hot plate with vacuum suction to hold the precursor article in close contact with the heating surface. Alternatively, the heating device can be a convection oven. The glass transition temperatures of the reactive polymers of this invention can generally range from at least 50° C. and up to and including 180° C. Thus, the polymeric layer can be heated at a temperature of less than 200° C. particularly when a plasticizer is present in the reactive composition. The duration of the heating procedure is generally less than 10 minutes with heating for least 10 seconds and up to and including 2 minutes being most likely. After the heating procedure, a faint image may be observable in the exposed regions of the polymeric layer due to the change in the index of refraction or physical contraction or expansion of the chemically altered reactive polymer. The optimal heating time and temperature can be readily determined using routine experimentation with a particular reactive composition.

At any time after the patternwise exposing or optional heating procedures, the reactive composition remaining in the non-exposed regions of the polymeric layer can be removed using an organic solvent in which the polymeric layer comprising the reactive composition is soluble or dispersible. In such procedures at least 50 weight % and typically at least 80 weight % or even at least 90 weight % of the polymeric layer is removed in the non-exposed regions, based on the total amount of reactive composition originally present in the polymeric layer in the non-exposed regions. Upon this removal of reactive composition from the non-exposed regions of the polymeric layer, the various articles described herein will contain de-blocked and crosslinked polymer in the exposed regions of the polymeric layer, along with reducing agent molecules, electroless seed metal ions, electroless seed metal nuclei, electroless seed metal halide, or electroless plated metal, depending upon the stage at which the non-exposed reactive composition has been removed.

The removal procedure can be carried out in any suitable manner, including immersion of the intermediate article into a suitable organic solvent or mixture of organic solvents or by spraying the organic solvent or mixture of organic solvents onto the intermediate article surface. Contact with the organic solvent (or mixture thereof) can be carried out for a suitable time and temperature so that reactive composition is desirably removed in the non-exposed regions but little removal (less than 10 weight % of the total material) occurs in the exposed regions of the polymeric layer containing the de-blocked and crosslinked polymer derived from the (a) reactive polymer in the reactive composition described above. For example, the contact time can be at least 10 seconds and up to and including 10 minutes, and the contact temperature can be at room temperature (about 20° C.) and up to and including 50° C.

Organic solvents that can used for this purpose include but are not limited to ketones, such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer derived from the (a) reactive polymer in the reactive composition described above, and the non-exposed regions of the polymeric layer comprise little or no reactive composition.

Once patternwise exposure and optional heating have been carried out, the first exposed regions of the polymeric layer are contacted with electroless seed metal ions to form coordinated electroless seed metal ions in the first exposed regions of the polymeric layer. There are various ways that this contacting can be carried out. Typically, the entire article and the polymeric layer are immersed within a dilute aqueous-based solution, bath, or dispersion of the electroless seed metal ions for a sufficient time to coordinate the optimum number of electroless seed metal ions within the first exposed regions of the polymeric layer. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given polymeric layer and electroless seed metal ions that are used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that has an overall positive, negative, or neutral charge). Useful materials of this type include but not limited to, metal salts and metal-ligand complexes of nitrates, halides, acetates, cyanides, thiocyanates, amines, nitriles, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising first exposed regions and non-exposed regions, the first exposed regions comprising a pattern of electroless seed metal ions within the de-blocked and crosslinked polymer resulting from irradiation of the (a) reactive polymer in the reactive composition described above, and the non-exposed regions comprising a reactive composition as described above, comprising (a) reactive polymer, (b) compound that provides an acid, and (c) optionally, a photosensitizer, all as described above.

After the requisite time to react the electroless seed metal ions within the de-blocked and crosslinked polymer in the first exposed regions, the polymeric layer can be rinsed with distilled or deionized water or another aqueous-based solution for a suitable time and at a suitable temperature, usually room temperature or slightly higher.

Optionally at this point, the reactive composition can be removed in the non-exposed regions as described above, leaving the pattern of electroless seed metal ions in the exposed regions of the polymeric layer containing the de-blocked and crosslinked polymer derived from the (a) reactive polymer in the reactive composition described above.

If this procedure is carried out, an intermediate article is created that comprises a substrate and having disposed thereon exposed regions of a de-blocked and crosslinked polymeric layer and non-exposed regions of the polymeric layer comprising little or no reactive composition, wherein the exposed regions further comprise a pattern of electroless seed metal ions coordinated within the de-blocked and crosslinked polymer derived from the (a) reactive polymer within the reactive composition described above.

At least the first exposed regions of the polymeric layer are then contacted with a halide that reacts with the seed metal ions to form corresponding electroless seed metal halide in the first exposed regions of the polymeric layer. Halides can be provided as suitable halide salts to provide iodide ions, chloride ions, or bromide ions or a combination of two or more of these halides to form electroless seed metal halide in the first exposed regions of the polymeric layer. Chloride ions, iodide ions, or bromide ions or mixtures thereof are particularly useful.

This contacting with a halide can be carried out by immersing the intermediate article described above within an aqueous-based halide bath or halide solution of a suitable halide salt, or the aqueous-based halide solution can be sprayed or coated onto the polymeric layer in a uniform or patternwise manner. The time for this halide treatment can be at least 1 second and up to and including 30 minutes, and the temperature for the halide treatment can be room temperature (about 20° C.) and up to and including 95° C. The time and temperature and the type and amount of halide in a treatment bath can be optimized in order to provide the sufficient amount of corresponding electroless seed metal halide in the first exposed regions of the polymeric layer.

At this point, an intermediate article has been created, which intermediate article comprises a substrate and having thereon a polymeric layer comprising first exposed regions and non-exposed regions, the first exposed regions of the polymeric layer comprising a pattern of corresponding electroless seed metal halide in the de-blocked and crosslinked polymer derived from the (a) reactive polymer in the reactive composition described above, and non-exposed regions comprising the reactive composition described herein comprising (a) reactive polymer, (b) a compound that provides an acid, and (c) optionally, a photosensitizer, all as described above.

Optionally at this point, the reactive composition can be removed from the non-exposed regions as described above, leaving the pattern of electroless seed metal halide in the first exposed regions of the polymeric layer containing the de-blocked and crosslinked polymer derived from the (a) reactive polymer in the reactive composition described herein.

If this procedure is carried out, an intermediate article is created that comprises a substrate and having disposed thereon first exposed regions of the polymeric layer containing a de-blocked and crosslinked polymer derived from the (a) reactive polymer in the reactive composition described above, and non-exposed regions of the polymeric layer comprising little or no reactive composition, wherein the first exposed regions further comprise a pattern of electroless seed metal halide.

After this halide treatment, the polymeric layer can be optionally exposed again to convert at least some, or typically at least 20% (or more typically at least 50%), of the corresponding electroless seed metal halide in first exposed regions of the polymeric layer to corresponding electroless seed metal nuclei using radiation having a $\lambda_{max}$ of at least 150 nm and up to and including 450 nm, or more likely having $\lambda_{max}$ of at least 240 nm and up to and including 450 nm. The second exposed regions can be the same as or different from the first exposed regions, or the first and second exposed regions can partially overlap.

After this optional second exposure, the method provides another intermediate article comprising a substrate and having disposed thereon a polymeric layer comprising first exposed regions, second exposed regions, and non-exposed regions, the first exposed regions comprising corresponding electroless seed metal halide in the de-blocked and crosslinked polymer derived from the (a) reactive polymer in the reactive composition described above, the second exposed regions comprising a pattern of corresponding electroless seed metal with a latent image in the de-blocked and crosslinked polymer derived from the (a) reactive polymer in the reactive composition described above, and the non-exposed regions comprising a reactive composition as described above, comprising (a) reactive polymer, (b) compound that provides an acid, and (c) optionally, a photosensitizer, all as described above.

Optionally at this point, the reactive composition can be removed from the non-exposed regions as described above, leaving the pattern of electroless seed metal halide in the first exposed regions of the polymeric layer and a pattern of corresponding electroless seed metal halide with a latent image in the second exposed regions of the polymeric layer.

If this procedure is carried out, an intermediate article is created that comprises a substrate and having disposed thereon first exposed regions and second exposed regions of the polymeric layer containing a de-blocked and crosslinked polymer derived from the (a) reactive polymer in the reactive composition described above, and non-exposed regions of the polymeric layer comprising little or no reactive composition, wherein the first exposed regions further comprise a pattern of electroless seed metal halide and the second exposed regions further comprise a pattern of electroless seed metal halide with a latent image.

The polymeric layer comprising corresponding electroless seed metal halide in the first exposed regions, or corresponding electroless seed metal latent image in the second exposed regions, or both corresponding electroless seed metal halide in the first exposed regions and corresponding electroless seed metal latent image in the second exposed regions are then optionally contacted with a suitable aqueous-based reducing solution comprising one or more reducing agents. This contact develops the corresponding electroless seed metal latent image in the second exposed regions of the polymeric layer into corresponding electroless seed metal nuclei, if present. It is desirable that the contact with the reducing agent develops the corresponding electroless metal halide in the second exposed regions but does not develop the corresponding electroless seed metal halide in the first exposed regions if there is any present.

This contact with a reducing agent can be done by immersing the polymeric layer (or at least the first and second exposed regions) within an aqueous-based reducing solution for a suitable time to cause the desired change (development) in the second exposed regions. Alternatively, an aqueous-based reducing solution comprising one or more reducing agents can be sprayed or rolled uniformly onto the polymeric layer to accomplish the same results.

Useful reducing agents include but are not limited to, an organic borane, an aldehyde such as formaldehyde, aldehyde sugar, hydroquinone, or sugar (or polysaccharide) such as ascorbic acid, and metal ions such as tin(II), or a common silver halide photographic developer as described in *Research Disclosure* December 1978, publication 17643. These reducing agents can be used individually or in combination, and the total amount in the aqueous-based reducing solution can be at least 0.01 weight % and up to and including 20 weight % based on total solution weight. The amount can be readily optimized using routine experimentation. The reducing time and temperature can also be readily optimized in the same manner. Generally, the reducing temperature is at least room temperature (about 20° C.) and up to and including 99° C. and the reducing time can be for at least 1 second and up to and including 30 minutes.

For example, some embodiments of the present invention can be carried out using an aqueous-based reducing solution comprising 1 weight % of an organic borane such as dimethylamine borane (DMAB) at room temperature for up to 3 minutes. Longer or shorter times at higher temperatures are possible if needed.

After this reducing procedure, the polymeric layer, especially the first exposed regions or the second exposed regions, can be again washed using distilled water or deionized water or another aqueous-based solution for a suitable time to remove excess reducing agent.

The reducing procedure can provide another intermediate article that comprises a substrate and having thereon a polymeric layer comprising first exposed regions, second exposed regions, and non-exposed regions, the first exposed regions of the polymeric layer comprising a pattern of corresponding electroless seed metal halide in a de-blocked and crosslinked polymer derived from the (a) reactive polymer in the reactive composition described above, the second exposed regions of the polymeric layer comprising a pattern of corresponding electroless seed metal nuclei in a de-blocked and crosslinked polymer derived from the (a) reactive polymer in the reactive composition described above, and the non-exposed regions of the polymeric layer comprising a reactive composition as described herein comprising (a) reactive polymer, (b) a compound that provides an acid, and (c) optionally, a photosensitizer, all as described above.

Optionally at this point, the reactive composition can be removed from the non-exposed regions as described above, leaving a pattern of corresponding electroless seed metal halide in the first exposed regions of the polymeric layer and a pattern of corresponding electroless seed metal nuclei in the second exposed regions of the polymeric layer.

If this procedure is carried out, an intermediate article is created that comprises a substrate and having disposed thereon first exposed regions and second exposed regions of the polymeric layer containing a de-blocked and crosslinked polymer derived from the (a) reactive polymer in the reactive composition, and non-exposed regions of the polymeric layer comprising little or no reactive composition, wherein the first exposed regions further comprise a pattern of corresponding electroless seed metal halide and the second exposed regions further comprise a pattern of electroless seed metal nuclei.

The polymeric layer comprising corresponding electroless seed metal halide in the first exposed regions, or corresponding electroless seed metal nuclei in the second exposed regions, or both corresponding electroless seed metal halide in the first exposed regions and corresponding electroless seed metal nuclei in the second exposed regions, are then optionally contacted with a suitable fixing agent. This contact removes any remaining corresponding electroless seed metal halide from both the first exposed regions and the second exposed regions of the polymeric layer, while leaving behind any corresponding electroless seed metal nuclei in the second exposed regions.

This contact with a fixing agent can be done by immersing the polymeric layer (or at least the first and second exposed regions) within an aqueous-based fixing solution containing one or more fixing agents for a suitable time to cause the desired change (removal of the corresponding electroless metal halide) in the first exposed regions and the second exposed regions. Alternatively, an aqueous-based fixing solution can be sprayed or rolled uniformly onto the polymeric layer to accomplish the same results.

Useful fixing agents include but are not limited to, sulfites, thiocyanates, thiosulfates, thioureas, halides, ammonia, chelates such as ethylenediaminetetracetic acid, and mixtures thereof. Fixing accelerators can also be included in the aqueous-based fixing solutions, which compounds include, but are not limited to, thioethers and mercaptotriazoles. The fixing agents can be present as salts (that is alkali metal or ammonium salts) as is well known in the art, for instance as described in *Research Disclosure* December 1978 publication 38957. The total amount of fixing agents in the aqueous-based fixing solution can be at least 0.01 weight % and up to and including 50 weight % based on total fixing solution weight. The fixing agent amount can be readily optimized using routine experimentation. The fixing time and temperature can also be readily optimized in the same manner. Generally, the fixing temperature is at least room temperature (about 20° C.) and up to and including 99° C. and the reducing time can be for at least 1 second and up to and including 30 minutes.

For example, some embodiments of the present invention can be carried out using an aqueous-based fixing solution comprising 20 solution weight % of sodium thiosulfate in combination with 1.5 solution weight % of sodium sulfite at room temperature for 3 minutes. Longer or shorter times at higher temperatures are possible.

After this fixing procedure, the polymeric layer, especially the first exposed regions or the second exposed regions, can be again washed using distilled water or deionized water or another aqueous-based solution for a suitable time to remove excess fixing agent.

The fixing procedure can provide another intermediate article that comprises a substrate and having thereon a polymeric layer comprising first exposed regions, second exposed regions, and non-exposed regions, the first exposed regions of the polymeric layer from which the pattern of corresponding electroless seed metal halide has been removed, the first exposed regions comprising the de-blocked and crosslinked polymer being derived from (a) reactive polymer in a reactive composition as described above, the second exposed regions of the polymeric layer comprising a pattern of corresponding electroless seed metal nuclei the de-blocked and crosslinked polymer being derived from (a) reactive polymer in a reactive composition as described above, and the non-exposed regions of the polymeric layer comprising a reactive composition as described herein comprising (a) reactive polymer, (b) a compound that provides an acid, and (c) optionally, a photosensitizer, all as described above.

Optionally at this point, the reactive composition can be removed in the non-exposed regions as described above, leaving corresponding electroless seed metal nuclei in the second exposed regions of the polymeric layer containing a de-blocked and crosslinked polymer derived from the (a) reactive polymer in the reactive composition described above.

If this procedure is carried out, an intermediate article is created that comprises a substrate and having disposed thereon first exposed regions and second exposed regions of the polymeric layer containing a de-blocked and crosslinked polymer derived from the (a) reactive polymer in the reactive composition as described above, and non-exposed regions of the polymeric layer comprising little or no reactive composition, the first exposed regions comprising little or no corresponding electroless seed metal halide, and the second exposed regions comprising corresponding electroless seed metal nuclei in the de-blocked and crosslinked polymer derived from the (a) reactive polymer in the reactive composition described above.

The intermediate article that has been treated as described above can be immediately immersed in an aqueous-based electroless metal plating bath or solution, or the treated article can be stored with just the catalytic pattern comprising corresponding electroless seed metal nuclei for use at a later time.

The intermediate article can be contacted with an electroless plating metal that is the same as or different from the corresponding electroless seed metal nuclei. In most embodiments, the electroless plating metal is a metal different from the corresponding electroless seed metal nuclei.

Any metal that will likely electrolessly "plate" on the corresponding electroless seed metal nuclei can be used at this point, but in most embodiments, the electroless plating metal can be for example copper(II), silver(I), gold(IV), palladium (II), platinum(II), nickel(II), chromium(II), and combinations thereof. Copper(II), silver(I), and nickel(II) are particularly useful electroless plating metals.

The one or more electroless plating metals can be present in an aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. Copper electroless plating can be carried out at room temperature for several seconds and up to several hours depending upon the desired deposition rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising first exposed regions (and optional second exposed regions) and non-exposed regions, the first exposed regions comprising a pattern of corresponding electroless seed metal nuclei that have been electrolessly plated with the same or different metal in a de-blocked and crosslinked polymer derived from the (a) reactive polymer in the reactive composition described herein, and the non-exposed regions comprising a reactive composition as described herein comprising (a) a reactive polymer, (b) compound that provides an acid, and (c) optionally, a photosensitizer, all as described above.

Optionally, the reactive composition can be removed from the non-exposed regions of the polymeric layer after electrolessly plating the corresponding electroless seed metal nuclei so that the resulting product article comprises a pattern of electrolessly plated metal in the first exposed regions of the polymeric layer containing a de-blocked and crosslinked polymer derived from the (a) reactive polymer in the reactive composition described above, but the product article comprises little or no reactive composition in the non-exposed regions of the polymeric layer.

To change the surface of the electrolessly plated metal for visual or durability reasons, it is possible that a variety of post-treatments can be employed including surface plating of still another (third) metal such as nickel or silver on the "second" electrolessly plated metal (this procedure is sometimes known as "capping"), or the creation of a metal oxide, metal sulfide, or a metal selenide layer that is adequate to change the surface color and scattering properties without reducing the conductivity of the electroless plated (second) metal. Depending upon the metals used in the various capping procedures of the method, it may be desirable to treat the electrolessly plated metal with a seed metal catalyst in an aqueous-based seed metal catalyst solution to facilitate deposition of additional metals.

Alternatively, the resulting product article can undergo further treated to decompose any residual onium salt on the polymeric layer or to change the visual characteristics and or durability of the electrolessly plated metal. For example, to decompose any remaining onium salt or other acid-generating (b) compound, the polymeric film can be uniformly exposed or blanket flashed with ultraviolet radiation and baked (or heated) similarly as described above after the initial exposure.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments, the treatment conditions can be the same or different.

In addition, multiple treatments with an aqueous-based halide solution, aqueous-based reducing solution, or aqueous-based fixing solution, can be carried out in sequence, using the same or different compositions and conditions. Sequential washing or rinsing steps can also be carried out where appropriate.

Further, the electroless plating procedures can be carried out multiple times, in sequence, using the same or different electroless plating metal and the same or different electroless plating conditions and times.

Electroless Plating Method 5:

The method of this invention for forming a pattern in a polymeric layer, comprises:

providing a polymeric layer (as in forming the described precursor article), the polymeric layer comprising a reactive composition as described above, comprising (a) a reactive polymer, (b) a compound that provides a cleaving acid, and (c) optionally, a photosensitizer, all as described above. This polymeric layer can be formed on a suitable substrate, if desired, as described above by suitable application of the reactive composition, after which the reactive composition is typically dried before the resulting article is used in the method of this invention.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and exposed regions comprising a polymer comprising pendant -arylene-XH groups. This exposure can be provided with any suitable exposing source or device that provides the desired radiation including but not limited to, various arc lamps and LED sources. The particular exposing source can be chosen depending upon the absorption characteristics of the particular reactive composition used. The exposing radiation can be projected through a lens or mask element that can be in physical contact or in proximity (not in physical contact) with the outer surface of the polymeric layer. Exposure time can range from a fraction (0.1) of a second and up to and including 10 minutes depending upon the intensity of the radiation source and the reactive compositions. Suitable masks can be obtained by known methods including but not limited to photothermographic methods, flexographic methods, or vacuum deposition of a chrome mask onto a suitable substrate such as quartz or high quality optical glass.

It is optional but desirable to heat or bake the polymeric layer in the precursor article simultaneously with or after the patternwise exposure but generally before contacting the exposed polymeric layer with electroless seed metal ions (described below). In most embodiments, this heating is carried out at least after the patternwise exposure of the polymeric layer, but it can be carried out both during and after the patternwise exposure of the polymeric layer. The heating is generally at a temperature in the range of or exceeding the glass transition temperature of the polymeric layer [that is similar to or the same as the glass transition temperature of the (a) reactive polymer]. Such heating can be accomplished on a hot plate with vacuum suction to hold the precursor article in close contact with the heating surface. Alternatively, the heating device can be a convection oven. The glass transition temperatures of the (a) reactive polymers useful in the practice of this invention can generally range from at least 50° C. and up to and including 180° C. Thus, polymeric layer can be heated at a temperature of less than 200° C. particularly if a plasticizer is present in the reactive composition. The duration of the heating procedure is generally less than 10 minutes with heating for least 10 seconds and up to and including 5 minutes being most likely. After the heating procedure, a faint image may be observable in the exposed regions of the polymeric layer due to the change in the index of refraction or physical contraction or expansion of the chemically altered (a) reactive polymer. The optimal heating time and temperature can be readily determined with routine experimentation depending upon the particular reactive composition.

At any time after the patternwise exposing or optional heating procedures, the reactive composition remaining in the non-exposed regions of the polymeric layer can be removed using an organic solvent in which the polymeric layer comprising the reactive composition is soluble or dispersible. In such procedures at least 50 weight % and typically at least 80 weight % or even at least 90 weight % of the reactive composition is removed in the non-exposed regions, based on the total amount of reactive composition originally present in the non-exposed regions. Upon this removal of reactive composition from the non-exposed regions of the polymeric layer, the various articles described herein will contain de-blocked and crosslinked reactive polymer in the exposed regions of the polymeric layer, along with non-reducing reagent molecules, electroless seed metal ions, electroless seed metal nuclei, or electroless plated metal, depending upon the stage at which the non-exposed reactive composition has been removed.

The removal procedure can be carried out in any suitable manner, including immersion of the intermediate article into a suitable organic solvent or mixture of organic solvents or by spraying the organic solvent or mixture of organic solvents onto the intermediate article surface. Contact with the organic solvent (or mixture thereof) can be carried out for a suitable time and temperature so that reactive composition is desirably removed in the non-exposed regions but little removal (less than 10 weight % of the total material) occurs in the exposed regions of the polymeric layer containing the crosslinked reactive polymer. For example, the contact time can be at least 10 seconds and up to and including 10 minutes, and the contact temperature can be at room temperature (about 20° C.) and up to and including 50° C.

Organic solvents that can used for this purpose include but are not limited to ketones, such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer derived from the (a) reactive polymer in the reactive composition described above, and the non-exposed regions of the polymeric layer comprise little or no reactive composition.

Once patternwise exposure and optional heating have been carried out, the exposed regions of the polymeric layer are contacted with electroless seed metal ions to form coordinated electroless seed metal ions in the exposed regions of the polymeric layer. These electroless seed metal ions form catalytic sites for electroless metal plating (deposition of metal). There are various ways that this contacting can be carried out. Typically, the entire precursor article is immersed within a dilute aqueous-based solution, bath, or dispersion of the electroless seed metal ions for a sufficient time to coordinate the optimum number of electroless seed metal ions within the exposed regions of the polymeric layer. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given polymeric layer and electroless seed metal ions that are to be used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but not limited to, metal salts and metal-ligand complexes of nitrates, halides, acetates, cyanides, amines, nitriles, thiocyanates, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising exposed regions and non-exposed regions, the exposed regions comprising a pattern of electroless seed metal ions within the de-blocked and crosslinked polymer resulting from the irradiation of the (a) reactive polymer in the reactive composition described herein, and the non-exposed regions comprising the reactive composition described herein comprising (a) reactive polymer, (b) a compound that provides an acid, and (c) optionally, a photosensitizer, all as described above.

After the requisite time to react the electroless seed metal ions within with the de-blocked and crosslinked polymer in the exposed regions, the polymeric layer can be rinsed with distilled or deionized water or another aqueous-based solution for a suitable time and at a suitable temperature, for example usually room temperature or slightly higher.

Optionally at this point, the reactive composition can be removed from the non-exposed regions of the polymeric layer as described above, leaving the pattern of electroless seed metal ions in the exposed regions of the polymeric layer containing the de-blocked and crosslinked polymer derived from the (a) reactive polymer in the reactive composition described above.

If this procedure is carried out, an intermediate article is created that comprises a substrate and having disposed thereon exposed regions of the polymeric layer containing a de-blocked and crosslinked polymer derived from the (a) reactive polymer in the reactive composition described above, and non-exposed regions of the polymeric layer comprising little or no reactive composition, wherein the exposed regions further comprise a pattern of electroless seed metal ions coordinated within the de-blocked and crosslinked polymer.

The electroless seed metal ions in the exposed regions of the polymeric layer are then contacted with a non-reducing reagent that reacts with the electroless seed metal ions to form an electroless seed metal compound (containing the non-reducing reagent) deposited within the exposed regions of the polymeric layer containing the de-blocked and crosslinked polymer derived from the (a) reactive polymer in the reactive composition described above.

Useful non-reducing reagents include any compound that will covalently, ionically, or otherwise bond to or react with the electroless seed metal ions to form the electroless seed metal compound. Useful non-reducing reagents include those that provide electroless seed metal compounds having a $pK_{sp}$ value of less than 40, and for example, a $pK_{sp}$ that is greater than 4 and less than 40. For example, such useful non-reducing reagents include but are not limited to, alkali metal and ammonium hydroxides, thiosulfates, thiocyanates, sulfites, small organic acids, and combinations thereof. Halides are also useful non-reducing reagents for this invention. Alkali metal hydroxides are particularly useful including mixtures thereof.

This contacting procedure can be carried out in various ways including immersing the intermediate article in an aqueous-based non-reducing solution comprising one or more non-reducing reagents at a concentration of at least 1 weight % based on total aqueous-based non-reducing solution weight. Alternatively, an aqueous-based non-reducing solution can be sprayed or coated onto the polymeric layer in the intermediate article. The time and temperature for this contacting would be readily apparent to one skilled in the art in order to best achieve the desired bonding. For example, the contacting can be carried out at room temperature (about 20° C.) and up to and including 95° C. and the time can be for at least 1 second and up to and including 30 minutes.

After this contact with the non-reducing reagent, the polymeric layer, especially the exposed regions, can be again washed using distilled water or deionized water or another aqueous-based solution under suitable conditions of time and temperature.

At this stage, another intermediate article has been created, which intermediate article comprises a substrate and having disposed thereon a polymeric layer comprising exposed regions and non-exposed regions, the exposed regions of the polymeric layer comprising a pattern of an electroless seed metal compound (comprising a non-reducing reagent as described above) and a de-blocked and crosslinked polymer derived from the (a) reactive polymer in the reactive composition described above, wherein the electroless seed metal compound has a $pK_{sp}$ of less than 40, and the non-exposed regions comprising a reactive composition described herein comprising (a) reactive polymer, (b) compound that provides an acid, and (c) optionally, a photosensitizer, all as described above.

Optionally at this point, the reactive composition can be removed from the non-exposed regions of the polymeric layer as described above, leaving the pattern of electroless seed metal compound in the exposed regions of the polymeric layer containing the de-blocked and crosslinked polymer derived from the (a) reactive polymer in the reactive composition described above.

If this procedure is carried out, an intermediate article is created that comprises a substrate and having disposed thereon exposed regions of the polymeric layer containing a de-blocked and crosslinked polymer derived from the (a) reactive polymer in the reactive composition described above, and non-exposed regions of the polymeric layer comprising little or no reactive composition, wherein the exposed regions further comprise a pattern of electroless seed metal compound (comprising the non-reducing compound as described above).

This intermediate article can be immediately immersed in an aqueous-based electroless metal plating bath or solution, or the intermediate article can be stored with just the catalytic pattern comprising electroless seed metal compound for use at a later time.

The intermediate article can be contacted with an electroless plating metal that is the same as or different from the metal within the electroless seed metal compound. In most embodiments, the electroless plating metal is a different metal from the metal within the electroless seed metal compound.

Any metal that will likely electrolessly "plate" on the electroless seed metal compound can be used at this point, but in most embodiments, the electroless plating metal can be for example copper(II), silver(I), gold(IV), palladium(II), platinum(II), nickel(II), chromium(II), and combinations thereof. Copper(II), silver(I), and nickel(II) are particularly useful electroless plating metals.

The one or more electroless plating metals can be present in an aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the product article is removed from the aqueous-based electroless plating bath or solution and can again be washed using distilled water or deionized water or another aqueous-based solution to remove any residual electroless plating chemistry or onium salts. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of an electroless seed metal compound (comprising a non-reducing reagent as described above) which has been electrolessly plated with the same or different metal that is part of the electroless seed metal compound within a de-blocked and crosslinked polymer derived from the (a) reactive polymer in the reactive composition described above, and the non-exposed regions comprising a reactive composition as described herein comprising (a) a reactive polymer, (b)

compound that provides an acid, and (c) optionally, a photosensitizes, all as described above.

Optionally at this point, the reactive composition can be removed from the non-exposed regions of the polymeric layer after electrolessly plating the corresponding electroless seed metal nuclei so that the resulting article comprises a pattern of an electroless seed metal compound (comprising a non-reducing reagent as described above) that has been electrolessly plated with the same or different metal that is part of the electroless seed metal compound, within the de-blocked and crosslinked polymer derived from the (a) reactive polymer in the reactive composition described above, but the product article comprises little or no reactive composition in the non-exposed regions of the polymeric layer.

To change the surface of the electroless plated metal for visual or durability reasons, it is possible that a variety of post-treatments can be employed including surface plating of still another (third) metal such as nickel or silver on the "second" electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, is may be desirable to treat the electrolessly plated metal with a seed metal catalyst in an aqueous-based seed metal catalyst solution to facilitate deposition of additional metals.

Alternatively, the resulting product article can undergo further treated to decompose any residual onium salt on the polymeric layer or to change the visual characteristics and or durability of the electrolessly plated metal. For example, to decompose any remaining onium salt or other acid-generating (b) compound, the polymeric film can be uniformly exposed or blanket flashed with ultraviolet radiation and baked (or heated) similarly as described above after the initial exposure.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments, the treatment conditions or compositions can be the same or different.

In addition, multiple treatments with an aqueous-based non-reducing solution can be carried out in sequence, using the same or different non-reducing conditions and compositions. Sequential washing or rinsing steps can also be carried out where appropriate.

Further, the electroless plating procedures can be carried out multiple times, in sequence, using the same or different electroless plating metal and the same or different electroless plating conditions and times.

It is also possible to use this article comprising the noted pattern of an electrolessly plated metal to incorporate a second or more patterns in the non-exposed regions. This can be accomplished by subjecting this article to the same sequence of procedures or steps using the same or different reagents and aqueous-based solutions to provide at least a second pattern in what would be considered second exposed regions since the electrolessly plated metal would be in the what is considered the first exposed regions. The second exposed regions can comprise all of the original non-exposed regions, or they can comprise only some of the non-exposed regions.

For example, to create a second pattern in the article having the electrolessly plated metal, the article can be treated or processed as follows, using conditions and aqueous-based solutions similar to or the same as those described above:

a) patternwise exposing the previously non-exposed regions to form second exposed regions in the polymeric layer, b) optionally heating the polymeric layer, c) contacting at least the exposed regions with an aqueous-based solution containing electroless seed metal ions, and optionally rinsing, d) contacting the second exposed regions with an aqueous-based non-reducing solution, and optionally rinsing, and e) electrolessly plating the same or different metal in the exposed regions.

The present invention provides at least the following embodiments and combinations thereof, but other combinations of features are considered to be within the present invention as a skilled artisan would appreciate from the teaching of this disclosure:

1. A method for forming a pattern in a polymeric layer, the method comprising:

providing a polymeric layer comprising a reactive composition that comprises:

(a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer, and patternwise exposing the polymeric layer to radiation having a $\lambda_{max}$ of at least 150 nm and up to and including 450 nm, to provide a polymeric layer comprising non-exposed regions and exposed regions comprising a polymer with pendant -arylene-XH groups, optionally heating the polymeric layer simultaneously with or after patternwise exposing the polymeric layer but before contacting the exposed regions of the polymeric layer with electroless seed metal ions, at a temperature sufficient to generate pendant -arylene-XH groups in the exposed regions of the polymeric layer, contacting the exposed regions of the polymeric layer with electroless seed metal ions to form a pattern of corresponding electroless seed metal ions in the exposed regions of the polymeric layer, reducing the pattern of electroless seed metal ions to provide a pattern of corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

2. A precursor article comprising a substrate and having disposed thereon a polymeric layer comprising a reactive composition that comprises:

(a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

3. An intermediate article comprising a substrate and having disposed thereon a polymeric layer comprising exposed regions and non-exposed regions, the exposed regions comprising a pattern of electroless seed metal ions in a de-blocked and crosslinked polymer derived from (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and the non-exposed regions comprising a reactive composition that comprises:

the (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

4. An intermediate article comprising a substrate and having disposed thereon a polymeric layer comprising exposed regions and non-exposed regions, the exposed regions comprising a pattern of electroless seed metal nuclei in a de-blocked and crosslinked polymer derived from (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and the non-exposed regions comprising a reactive composition that comprises:

the (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

5. An article comprising a substrate and having disposed thereon a polymeric layer comprising exposed regions and non-exposed regions, the exposed regions comprising a pattern of a corresponding electroless seed metal nuclei that has been electrolessly plated with the same or different metal in a de-blocked and crosslinked polymer derived from (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and the non-exposed regions comprising a reactive composition that comprises:

the (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, (b) compound that provides a cleaving acid upon exposure to radiation having a $\lambda_{max}$ of at least 150 nm and up to and including 450 nm, which cleaving acid has a pKa of 2 or less as measured in water, and (c) optionally, a photosensitizer.

6. Any of embodiments 1 to 5, wherein t-alkyl is a tertiary alkyl group having 4 to 8 carbon atoms.

7. Any of embodiments 1 to 6, wherein X is —NR— or —O—, R is hydrogen or methyl, and t-alkyl is a t-butyl group.

8. Any of embodiments 1 to 7, wherein the (a) reactive polymer is a vinyl polymer comprising pendant -phenylene-NH—C(=O)O-butyl groups.

9. Any of embodiments 1 to 8, wherein the (a) reactive polymer is a homopolymer comprising only recurring units that comprise the -arylene-X—C(=O)—O-t-alkyl groups.

10. Any of embodiments 1 to 9, wherein the (a) reactive polymer is a copolymer comprising:

-A- recurring units that comprise the same or different pendant pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and -B- recurring units that are different from the -A- recurring units, wherein the -A- recurring units comprise at least 50 mol % and up to and including 99 mol % of the total recurring units.

11. Any of embodiments 1 to 10, wherein the (a) reactive polymer comprises at least 50 weight % and up to 99.5 weight % of the total dry weight of the polymeric layer.

12. Any of embodiments 1 to 11, wherein the (b) compound is an onium salt.

13. Any of embodiments 1 to 12, wherein the (b) compound is an arylsulfonium salt or aryliodonium salt that provides a cleaving acid having a pKa of less than 2 as determined in water.

14. Any of embodiments 1 to 13, wherein the (c) photosensitizer is present in the polymeric layer in an amount of at least 1 weight % based on the total polymeric layer dry weight.

15. Any of embodiments 1, 3, and 6-14, wherein the electroless seed metal ions are selected from the group consisting of silver ions, platinum ions, palladium ions, gold ions, tin ions, rhodium ions, iridium ions, nickel ions, and copper ions.

16. Any of embodiments 1, 3, and 6-15, wherein the electroless seed metal ions are provided as a metal salt or metal-ligand complex.

17. Any of embodiments 1 and 5-16, wherein the electroless plating metal is selected from the group consisting of copper(II), silver(I), gold(IV), palladium(II), platinum(II), nickel(II), chromium(II), and combinations thereof.

18. Any of embodiments 1 and 6-17, further comprising heating the polymeric layer simultaneously with or immediately after patternwise exposing the polymeric layer at a temperature sufficient to generate pendant -arylene-XH groups.

19. Any of embodiments 1 and 6-18, comprising patternwise exposing the polymeric layer to radiation having a $\lambda_{max}$ of at least 150 nm and up to and including 330 nm.

20. Any of embodiments 1 and 6-19, wherein after electrolessly plating the corresponding electroless seed metal nuclei with the electroless plating metal, further exposing the polymeric layer to radiation having a $\lambda_{max}$ of at least 150 nm and up to and including 450 nm, and optionally heating during or after this exposing.

21. Any of embodiments 1 and 6-20, comprising reducing the electroless seed metal ions in the exposed regions of the polymeric layer with a reducing agent that is a borane, aldehyde, hydroquinone, ascorbic acid, or a sugar.

22. Any of embodiments 1 and 6-21, further comprising:
after the patternwise exposing and optional heating, removing the reactive composition in the non-exposed regions of the polymeric layer using a solvent in which the reactive composition is soluble or dispersible.

The following Examples are provided to illustrate the practice of this invention and are not meant to be limiting in any manner.

Preparation of Monomer t-Butoxycarbonyl-4-Aminophenyl Methacrylate Monomer (BOC-APM):

A 3-neck, round bottom flask equipped with a stirrer, condenser and nitrogen inlet was charged with the following: 25 g (0.1195 mol) of N-t-butoxycarbonyl-4-aminophenol ($M_w$ of 209.25 g/mole) 13.3 g (0.1314 mol) of triethylamine ($M_w$ of 101.19 g/mole) and 200 ml of dichloromethane (DCM). The flask and its contents were placed in an ice bath and slowly added dropwise were 13.74 g (0.1314 mol) of methacryloyl chloride ($M_w$=104.54 g/mole) diluted with 20 g of DCM. The reaction was continued for 12 to 16 hours. The final solution was extracted twice using 200 ml of 5% sodium hydroxide and twice with 200 ml of distilled water. The final solution was placed over magnesium sulfate for 30 minutes and the DCM was rotovapored off. Re-crystallization was carried out using a mixture of heptanes and ethyl acetate. The solids were collected and dried in vacuum oven on low heat overnight. The final product was white in appearance and was checked by NMR for purity.

Preparation of Homopolymer of t-Butoxycarbonyl-4-Aminophenyl Methacrylate-Poly(BOC-APM):

A single neck, round bottom flask was charged with 12 g (0.0433 mol) of t-butoxycarbonyl-4-aminophenyl methacrylate monomer ($M_w$ of 277.32 g/mole), 0.06 g (0.5 weight % of total solids) of 2,2'-azodi(2-methylbutyronitrile) (AMBN) and 36 g of tetrahydrofuran (THF). The contents were purged with nitrogen for about 30 minutes and heated in a constant temperature bath at 65° C. overnight. The resulting product was precipitated twice into methanol and the solids were collected between each precipitation and re-dissolved in THF. The solid product was then placed in a vacuum oven overnight on low heat. The product polymer had a $M_w$ of about 66,200 as determined by size exclusion chromatography (SEC) and a glass transition temperature (Tg) of 176.5° C. as determined by differential scanning calorimetry (DSC) analysis.

Preparation of the Electroless Copper Plating Bath

The following components were dissolved in a glass container that had been cleaned with concentrated nitric acid followed by a thorough rinse with distilled water to eliminate any trace of metal on the glass: Copper(II) sulfate pentahydrate (1.8 g), 6.25 g of tetrasodium EDTA (ethylenediaminetetraacetic acid) tetrahydrate, 0.005 g of potassium ferrocyanide trihydrate, 2.25 g of a 37 weight % formaldehyde solution, 80 g of distilled water, and about 2-3 g of a 45 weight % sodium hydroxide solution to adjust the pH of the resulting solution to 12.8.

Invention Example 1

Use of Articles for Electroless Copper Plating

The poly(BOC-APM) homopolymer described above (0.25 g) and 0.0925 g of triphenylsulfonium triflate onium salt (at a recurring unit to onium salt molar ratio of 4:1) that provides a cleaving acid, and 0.025 g of 2-t-butyl-9,10-ethoxyanthracene photosensitizer were dissolved in 4.6325 g of cyclopentanone with stirring. Dried polymeric layers (films) of the resulting reactive composition were prepared by spin coating this reactive composition formulation at 1200 RPM onto a 0.7 mm thick glass plate (substrate) that had been cleaned with acetone and methanol, then drying with filtered compressed air, to form precursor articles of this invention.

For Invention Example 1, samples of the precursor articles with the polymeric layers were exposed through a chrome-on-quartz contact mask to near ultraviolet light using a UVP UVL-21 lamp for 120 seconds to provide non-exposed regions and exposed regions in each polymeric layer. Using a hotplate, each polymeric layer was then heated at 200° C. for 5 minutes to provide a de-blocked and crosslinked polymer with de-blocked pendant phenyleneamino groups.

Each exposed and heated polymeric layer on the substrate was then immersed in a 0.4 molar silver nitrate solution for 5 minutes, rinsed in distilled water, immersed in a 1 weight % dimethylamine borane (DMAB) bath for 5 minutes, and rinsed again in distilled water to form a pattern of electroless seed silver metal (reduced from the seed silver ions) coordinated with the unblocked homopolymer in the exposed regions of the polymeric layer. Each polymeric layer on the substrate was then immersed in an electroless copper bath having the composition described above for 10 minutes and a conductive copper pattern was formed on the electroless seed silver metal in the exposed regions of the polymeric layer.

For Invention Example 1, other samples of the described polymeric layer were exposed to UV radiation for 30 seconds and the same process was carried out to produce conductive copper plating in the exposed patterns of electroless seed silver metal.

Still other samples of the same polymeric layer were exposed to UV radiation for either 15 seconds or 7 seconds and the same process was carried out. However, in these Comparative Examples, while some copper plating occurred in the electroless seed silver metal pattern in each polymeric layer sample, the copper thickness in the patterns was insufficient to provide desired electrical conductivity.

Preparation of 4-t-Butoxycarbonyloxystyrene Monomer:

To a single neck 250 ml round bottom were added 10.0 g (0.617 moles) of 4-acetoxystyrene, 13.46 g (0.617 moles) of di-t-butyldicarbonate and 52 ml (15% mole excess) of a 25 weight % solution of tetramethylammonium hydroxide and the resulting reaction mixture was stirred under nitrogen at room temperature for about 18 hours. The reaction mixture was extracted twice with ether (50 ml) and washed once with a 25 weight % solution of tetramethylammonium hydroxide (50 ml) and then twice with water (50 ml). The organic products were dried over magnesium sulfate and evaporated to dryness leaving a clear colorless oil (12.16 g, 90% yield).

Preparation of Poly(t-Butoxycarbonyloxy Styrene) Poly(t-BOC Styrene):

To a 100 ml single neck flask were added 5.0 g (0.023 moles) of 4-t-butoxycarbonyloxystyrene and 0.025 g (0.5 weight % based on monomer weight) of 2,2'-azobis(2-methylbutylronitrile) as initiator dissolved in 15 g of tetrahydrofuran (THF) for a concentration of 25% solids and the reaction mixture was purged with nitrogen for about 30 minutes. The flask was capped with a septum and placed in a constant temperature bath at 65° C. overnight. The reaction mixture was then cooled, the resulting polymer was precipitated twice into methanol, and the solids were collected between each precipitation and re-dissolved into THF at 25% solids. The resulting polymer was then dried in a vacuum oven overnight at room temperature to obtain 3.08 g (62% yield) of a white fluffy solid. The desired polymer product had an $M_w$ of about 125,000 as determined by size exclusion chromatography (SEC) and a glass transition temperature ($T_g$) of 128° C. as determined by differential scanning calorimetry analysis.

Invention Example 2

A sample (0.5 g) of poly(t-butoxycarbonyloxystyrene) and 0.048 g of (4-methylphenyl)diphenylsulfonium triflate salt (a monomer unit to onium salt molar ratio of 20:1) were dissolved in 4.45 g of cyclopentanone with stirring. Coatings of this reactive composition were prepared by spin coating the reactive composition at 1500 RPM onto a 7.4 mil (0.019 cm) thick poly(ethylene terephthalate) substrate having a polymeric adhesion layer consisting of a copolymer derived from glycidyl methacrylate and butyl acrylate that was applied before film stretching as described above.

The resulting precursor article was exposed to broadband ultraviolet light through a chrome-on-quartz contact mask for 90 seconds, followed by heating using a vacuum hotplate at 110° C. for 5 minutes. The exposed and heated article was then immersed in a 5 weight % sodium carbonate solution for 4 minutes, rinsed in distilled water, immersed in a 0.4 molar silver nitrate solution for 4 minutes, rinsed in distilled water, immersed in a 1 weight % dimethylamine borane (DMAB) bath for 2 minutes, and then rinsed using distilled water. The thus treated article was then immersed in the electroless copper bath described above for 10 minutes to form a highly conductive copper film in all exposed regions of the polymeric layer. Line widths of 5 to 6 µm diameter were faithfully reproduced and showed high conductivity.

Additional precursor articles were similarly prepared and treated using various post-exposure heating conditions. Heating at 120° C. for 30 seconds also produced a conductive copper pattern in the exposed regions. Heating at 140° C. for 30 seconds appeared to inhibit the copper plating.

Invention Examples 3-15 and Comparative Example 1

Various Electroless Metal Plating Methods

A reactive composition was prepared as described in Invention Example 1 except that the level of (4-methylphenyl)diphenylsulfonium triflate salt was doubled to reduce the recurring unit to onium salt ratio to 10:1. Precursor articles were prepared using spin coatings of the reactive composition identically to those described in Invention Example 1. The various methods of this invention were carried out and highly conductive copper patterns were readily formed from the precursor articles and reactive compositions according to the present invention using the conditions and results described in TABLE I below.

TABLE I

| Method/Example | Exposure Time | Heating Conditions | Pre-bath Conditions | Seed Metal Ion Conditions | Reducing Agent Bath | Time in Electroless Copper Bath | Results |
| --- | --- | --- | --- | --- | --- | --- | --- |
| 1/Invention 3 | 90 seconds | 2 minutes at 110° C. | 4 minutes; 5 wt, % $Na_2CO_3$ | 4 minutes; 0.4 molar $AgNO_3$ | 2 minutes; 1 wt. % DMAB | 10 minutes | Conductive pattern formed |
| 1/Invention 4 | 90 seconds | 2 minutes at 110° C. | 2 minutes; 5 wt. % $Na_2CO_3$ | 4 minutes; 0.4 molar $AgNO_3$ | 2 minutes; 1 wt. % DMAB | 10 minutes | Conductive pattern formed |
| 1/Invention 5 | 90 seconds | 2 minutes at 110° C. | 2 minutes; 5 wt. % $Na_2CO_3$ | 2 minutes; 0.4 molar $AgNO_3$s | 1 minutes; 1 wt. % DMAB | 10 minutes | Conductive pattern formed |
| 1/Invention 6 | 90 seconds | 2 minutes at 110° C. | None | 2 minutes; 0.4 molar $AgNO_3$ | 1 minutes; 1 wt. % DMAB | 10 minutes | Conductive pattern formed |
| 1/Invention 7 | 90 seconds | 2 minutes at 90° C. | 2 minutes; 5 wt. % $Na_2CO_3$ | 2 minutes; 0.4 molar $AgNO_3$ | 1 minutes; 1 wt. % DMAB | 10 minutes | Conductive pattern formed |
| 1/Invention 8 | 30 seconds | 2 minutes at 110° C. | 4 minutes; 5 wt. % $Na_2CO_3$ | 4 minutes; 0.4 molar $AgNO_3$ | 2 minutes; 1 wt. % DMAB | 10 minutes | No copper plating occurred |
| 1/Invention 9 | 60 seconds | 2 minutes at 110° C. | 4 minutes; 5 wt. % $Na_2CO_3$ | 4 minutes; 0.4 molar $AgNO_3$ | 2 minutes; 1 wt. % DMAB | 10 minutes | Some copper plating occurred |
| 1/Invention 10 | 150 seconds | 2 minutes at 110° C. | 4 minutes; 5 wt. % $Na_2CO_3$ | 4 minutes; 0.4 molar $AgNO_3$ | 2 minutes; 1 wt. % DMAB | 10 minutes | Fair copper plating occurred |
| Comparative Example 1 | 90 seconds | 2 minutes at 90° C. | None | None | None | 10 minutes | No copper plating occurred |
| 2/Invention 11 | 90 seconds | 2 minutes at 90° C. | 1 minute; 1 wt. % DMAB | 4 minutes; 0.4 molar $AgNO_3$ | None | 10 minutes | Highly Conductive pattern formed |
| 2/Invention 12 | 90 seconds | 2 minutes at 90° C. | 2 minutes: 5 wt. % $Na_2CO_3$; then 2 minutes: 0.06 molar $SnCl_2$ bath | 4 minutes; 0.4 molar $AgNO_3$ | None | 10 minutes | Conductive pattern formed with some copper in unexposed regions |
| 3/Invention 13 | 90 seconds | 2 minutes at 90° C. | 2 minutes: 5 wt. % $Na_2CO_3$; 2 minutes: $SnCl_2$ bath | 4 minutes; 0.4 molar $AgNO_3$ | 1 second; 1 wt. % hydrogen peroxide | 10 minutes | Conductive pattern formed |

TABLE I-continued

| Method/Example | Exposure Time | Heating Conditions | Pre-bath Conditions | Seed Metal Ion Conditions | Reducing Agent Bath | Time in Electroless Copper Bath | Results |
|---|---|---|---|---|---|---|---|
| 4/Invention 14 | 90 seconds | 2 minutes at 90° C. | 4 minutes; 5 wt. % Na$_2$CO$_3$ | 4 minutes 0.4 molar AgNO$_3$ | 5 minutes in 1 wt. % KCl bath then 1 minute in 1 wt. % DMAB bath | 10 minutes | Highly Conductive pattern formed |
| 5/Invention 15 | 90 seconds | 2 minutes at 90° C. | None | 2 minutes 0.4 molar AgNO$_3$ | none | 10 minutes | Conductive pattern formed |

The results described above show that it is desirable to optimize the exposure and heating conditions before contact of the article with the electroless seed metal ions. The process conditions of the treatments used before electroless copper plating can be varied widely and still provide a conductive copper pattern and these conditions can be optimized to achieve the most conductive copper patterns.

These results suggest that the reactive polymer used in Invention Examples 3-15 can be desirably crosslinked to prevent the polymeric layer from dissolving in the high pH processing baths, and the reactive polymer can assist in the formation of the catalytic seed metal to minimize or eliminate the need for a reducing bath before electroless copper plating.

The experiment labeled as Invention Example 8, showed poorer results of electroless copper plating because the exposure time was inadequate to provide sufficient reactive sites to provide sufficient electroless seed metal nuclei for adequate electroless copper plating. However, this result can be modified with sufficient exposure time.

The invention has been described in detail with particular reference to certain preferred embodiments thereof, but it will be understood that variations and modifications can be effected within the spirit and scope of the invention.

The invention claimed is:

1. A method for forming a pattern in a polymeric layer, the method comprising:
   providing a polymeric layer comprising a reactive composition that comprises:
   (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid,
   (b) compound that provides a cleaving acid upon exposure to radiation having a $\lambda_{max}$ of at least 150 nm and up to and including 450 nm, which cleaving acid has a pKa of 2 or less as measured in water, and
   (c) optionally, a photosensitizer, and
   patternwise exposing the polymeric layer to radiation having a $\lambda_{max}$ of at least 150 nm and up to and including 450 nm, to provide a polymeric layer comprising non-exposed regions and exposed regions comprising a polymer with pendant -arylene-XH groups,
   optionally heating the polymeric layer simultaneously with or after patternwise exposing the polymeric layer but before contacting the exposed regions of the polymeric layer with electroless seed metal ions, at a temperature sufficient to generate pendant -arylene-XH groups in the exposed regions of the polymeric layer,
   contacting the exposed regions of the polymeric layer with electroless seed metal ions to form a pattern of corresponding electroless seed metal ions in the exposed regions of the polymeric layer,
   reducing the pattern of electroless seed metal ions to provide a pattern of corresponding electroless seed metal nuclei in the exposed regions of the polymeric layer, and
   electrolessly plating the corresponding electroless seed metal nuclei in the exposed regions of the polymeric layer with a metal that is the same as or different from the corresponding electroless seed metal nuclei.

2. The method of claim 1, wherein t-alkyl is a tertiary alkyl group having 4 to 8 carbon atoms.

3. The method of claim 1, wherein X is —NR— or —O—, R is hydrogen or methyl, and t-alkyl is a t-butyl group.

4. The method of claim 1, wherein the (a) reactive polymer is a vinyl polymer comprising pendant -phenylene-NH—C(=O)O-t-butyl groups.

5. The method of claim 1, wherein the (a) reactive polymer is a homopolymer comprising only recurring units that comprise the -arylene-X—C(=O)—O-t-alkyl groups.

6. The method of claim 1, wherein the (a) reactive polymer is a copolymer comprising:
   -A- recurring units that comprise the same or different pendant pendant -arylene-X—C(=O)—O-t-alkyl groups wherein X is —NR—, —O—, or —S—, R is hydrogen or an alkyl group, and t-alkyl is a tertiary alkyl group, from which
   —C(=O)—O-t-alkyl groups are cleavable using a cleaving acid, and
   -B- recurring units that are different from the -A- recurring units,
   wherein the -A- recurring units comprise at least 50 mol % and up to and including 99 mol % of the total recurring units.

7. The method of claim 1, wherein the (a) reactive polymer comprises at least 50 weight % and up to 99.5 weight % of the total dry weight of the polymeric layer.

8. The method of claim 1, wherein the (b) compound is an arylsulfonium salt or aryliodonium salt that provides a cleaving acid having a pKa of less than 2 as determined in water.

9. The method of claim 1, wherein the (c) photosensitizer is present in the polymeric layer in an amount of at least 1 weight % based on the total polymeric layer dry weight.

10. The method of claim 1, comprising contacting the exposed regions in the polymeric layer with electroless seed metal ions selected from the group consisting of silver ions, platinum ions, palladium ions, gold ions, tin ions, rhodium ions, iridium ions, nickel ions, and copper ions.

11. The method of claim 1, comprising electrolessly plating with a metal that is selected from the group consisting of copper(II), silver(I), gold(IV), palladium(II), platinum(II), nickel(II), chromium(II), and combinations thereof.

12. The method of claim 1, further comprising heating the polymeric layer simultaneously with or immediately after patternwise exposing the polymeric layer at a temperature sufficient to generate pendant -arylene-XH groups.

13. The method of claim 1, wherein after electrolessly plating the corresponding electroless seed metal nuclei with the electroless plating metal,
further exposing the polymeric layer to radiation having a $\lambda_{max}$ of at least 150 nm and up to and including 450 nm, and optionally heating during or after this exposing.

14. The method of claim 1, comprising reducing the electroless seed metal ions in the exposed regions of the polymeric layer with a reducing agent that is a borane, aldehyde, hydroquinone, ascorbic acid, or a sugar.

15. The method of claim 1, further comprising:
after the patternwise exposing and optional heating, removing the reactive composition in the non-exposed regions of the polymeric layer using a solvent in which the reactive composition is soluble or dispersible.

16. An intermediate article comprising a substrate and having disposed thereon a polymeric layer comprising exposed regions and non-exposed regions,
the exposed regions comprising a pattern of electroless seed metal ions in a de-blocked and crosslinked polymer derived from a (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and
the non-exposed regions comprising a reactive composition that comprises:
the (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid,
(b) compound that provides a cleaving acid upon exposure to radiation having a $\lambda_{max}$ of at least 150 nm and up to and including 450 nm, which cleaving acid has a pKa of 2 or less as measured in water, and
(c) optionally, a photosensitizer.

17. An intermediate article comprising a substrate and having disposed thereon a polymeric layer comprising exposed regions and non-exposed regions,
the exposed regions comprising a pattern of electroless seed metal nuclei in a de-blocked and crosslinked polymer derived from a (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and
the non-exposed regions comprising a reactive composition that comprises:
the (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid,
(b) compound that provides a cleaving acid upon exposure to radiation having a $\lambda_{max}$ of at least 150 nm and up to and including 450 nm, which cleaving acid has a pKa of 2 or less as measured in water, and
(c) optionally, a photosensitizer.

18. A product article comprising a substrate and having disposed thereon a polymeric layer comprising exposed regions and non-exposed regions,
the exposed regions comprising a pattern of a corresponding electroless seed metal nuclei that has been electrolessly plated with the same or different metal in a de-blocked and crosslinked polymer derived from a (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid, and
the non-exposed regions comprising a reactive composition that comprises:
the (a) reactive polymer comprising pendant -arylene-X—C(=O)—O-t-alkyl groups wherein X is —NR—, —O—, or —S—, R is hydrogen or an alkyl group, and t-alkyl is a tertiary alkyl group, from which —C(=O)—O-t-alkyl groups are cleavable using a cleaving acid,
(b) compound that provides a cleaving acid upon exposure to radiation having a $\lambda_{max}$ of at least 150 nm and up to and including 450 nm, which cleaving acid has a pKa of 2 or less as measured in water, and
(c) optionally, a photosensitizer.

\* \* \* \* \*